United States Patent [19]

Shigehara et al.

[11] Patent Number: 5,661,414

[45] Date of Patent: Aug. 26, 1997

[54] OUTPUT CIRCUIT FOR USE IN A SEMICONDUCTOR INTEGRATED CIRCUIT

[75] Inventors: Hiroshi Shigehara, Tokyo; Masanori Kinugasa, Yokohama, both of Japan

[73] Assignee: Kabushiki Kaisha Toshiba, Kawasaki, Japan

[21] Appl. No.: 389,224

[22] Filed: Feb. 15, 1995

[30] Foreign Application Priority Data

Feb. 16, 1994 [JP] Japan .................................. 6-019432

[51] Int. Cl.$^6$ ............................................. H03K 19/0948
[52] U.S. Cl. .................. 326/81; 326/27; 326/58; 326/86
[58] Field of Search .................. 326/80–81, 83, 326/121, 21, 27, 86, 68, 57–58; 327/534, 537

[56] References Cited

U.S. PATENT DOCUMENTS

| | | | |
|---|---|---|---|
| 4,894,561 | 1/1990 | Nogami | 326/33 |
| 5,144,165 | 9/1992 | Dhong et al. | 326/83 |
| 5,151,619 | 9/1992 | Austin . | |
| 5,266,849 | 11/1993 | Kitahara et al. | 326/21 |
| 5,276,364 | 1/1994 | Wellheuser . | |
| 5,300,828 | 4/1994 | McClure | 326/83 |
| 5,338,978 | 8/1994 | Larsen et al. . | |
| 5,381,061 | 1/1995 | Davis | 327/534 |
| 5,382,846 | 1/1995 | Shigehara et al. . | |
| 5,406,140 | 4/1995 | Wert et al. | 326/86 |

FOREIGN PATENT DOCUMENTS

| | | |
|---|---|---|
| 0 498 377 | 8/1992 | European Pat. Off. . |
| 0 556 605 | 8/1993 | European Pat. Off. . |
| 0 620 650 | 10/1994 | European Pat. Off. . |
| 44 04 132 | 8/1994 | Germany . |
| 2 258 101 | 1/1993 | United Kingdom . |
| 94/18755 | 8/1994 | WIPO . |

OTHER PUBLICATIONS

Allmon et al., "System, Process, and Design Implications of a Reduced Supply Voltage Microprocessor", 1990 IEEE International Solid–State Circuits Conference, Digest of Technical Papers, Feb., 1990, pp. 48, 49, and 263.

*Primary Examiner*—Edward P. Westin
*Assistant Examiner*—Jon Santamauro
*Attorney, Agent, or Firm*—Banner & Witcoff, Ltd.

[57] ABSTRACT

An output circuit comprising an output stage and a control signal generator. The output stage is constituted by a first P-channel MOS transistor and an N-channel MOS transistor. The control signal generator generates a signal for driving the Gates of the MOS transistors, it comprises a NAND gate, a NOR gate NOR1 and an inverter INV1. The first P-channel MOS transistor of the output stage has a source and a back gate which are isolated in terms of potential. A second P-channel MOS transistor is provided, whose source-drain path is connected between the back gate and gate of the first P-channel MOS transistor incorporated in the output stage.

40 Claims, 23 Drawing Sheets

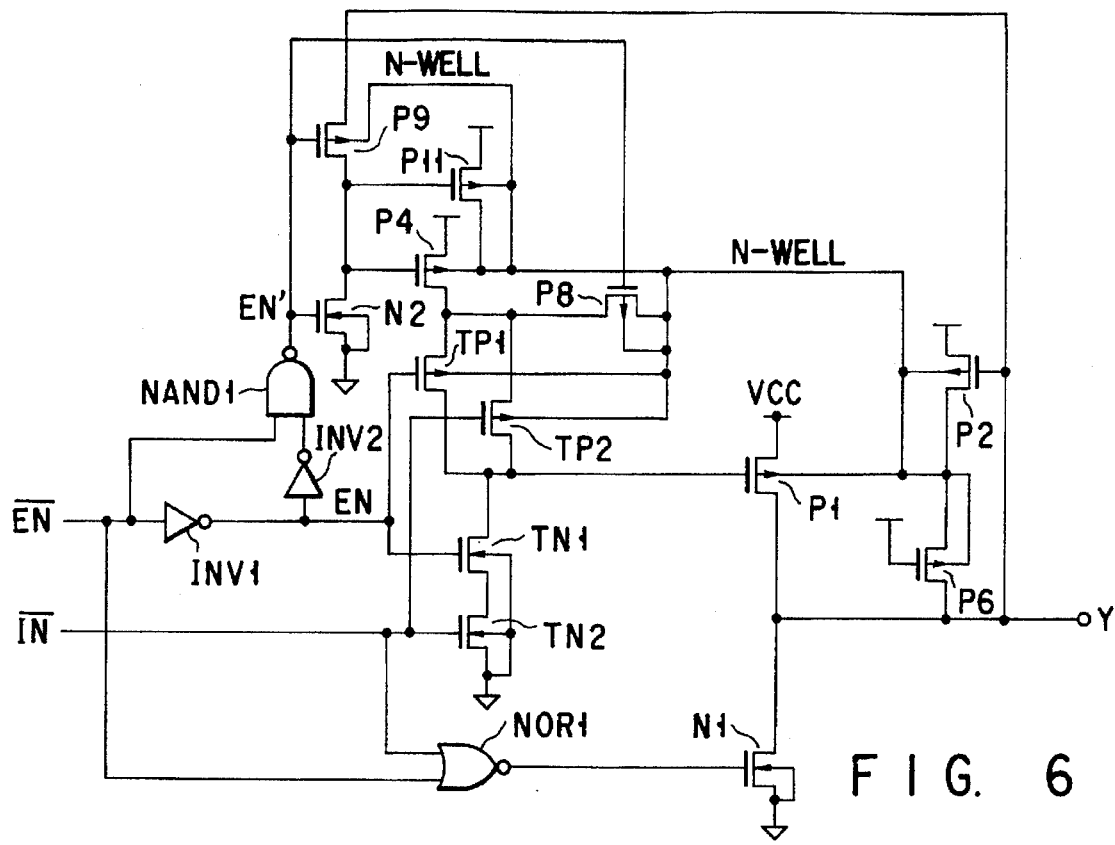
F I G. 6
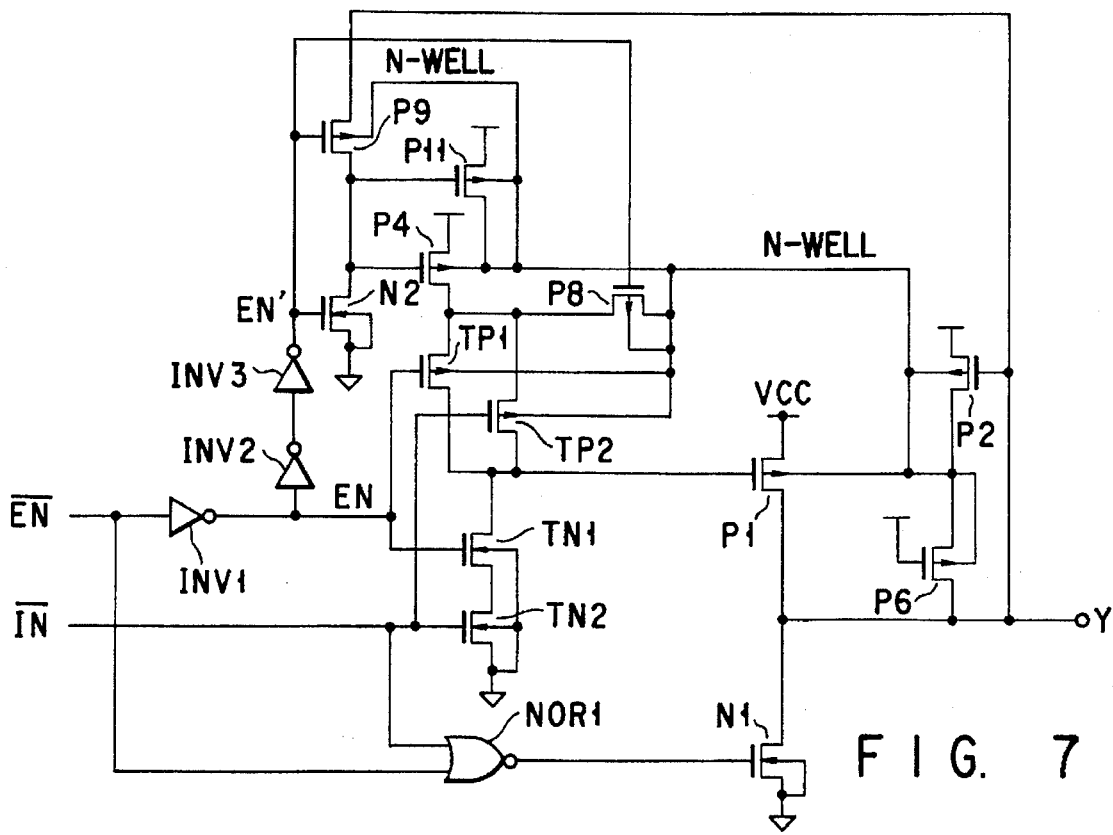
F I G. 7

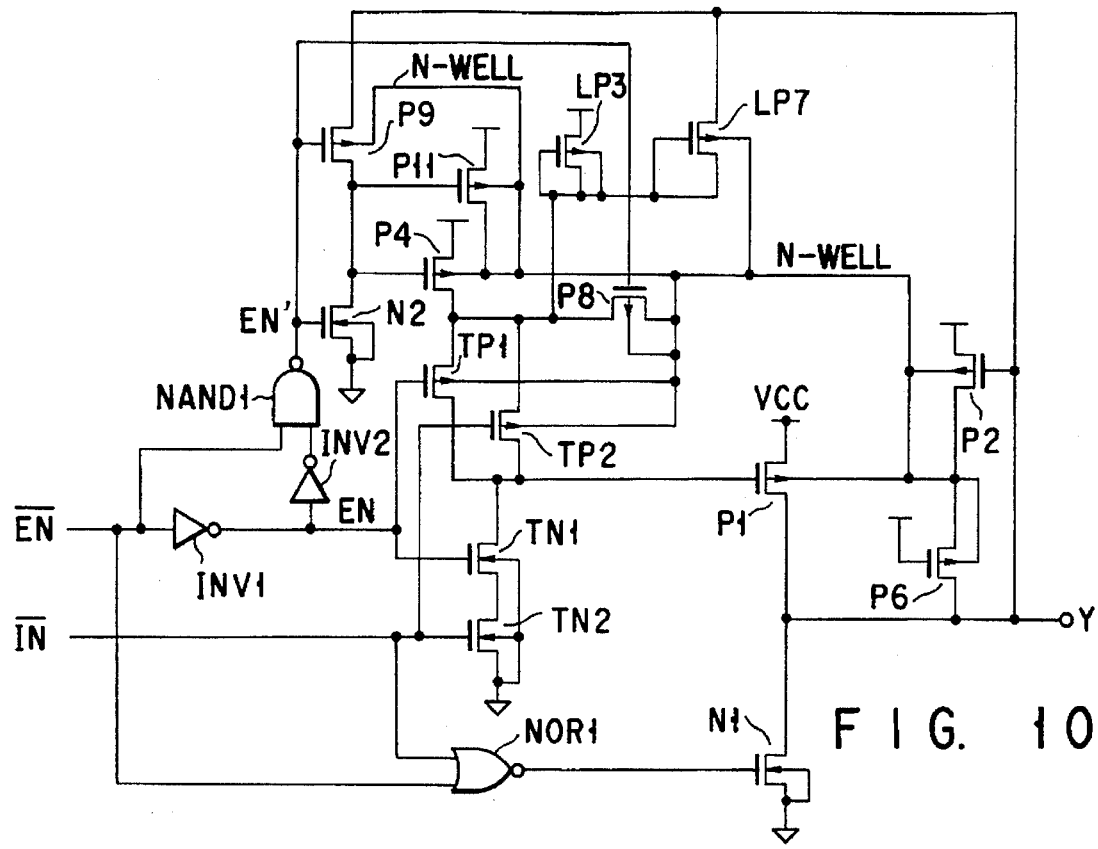
F I G. 10
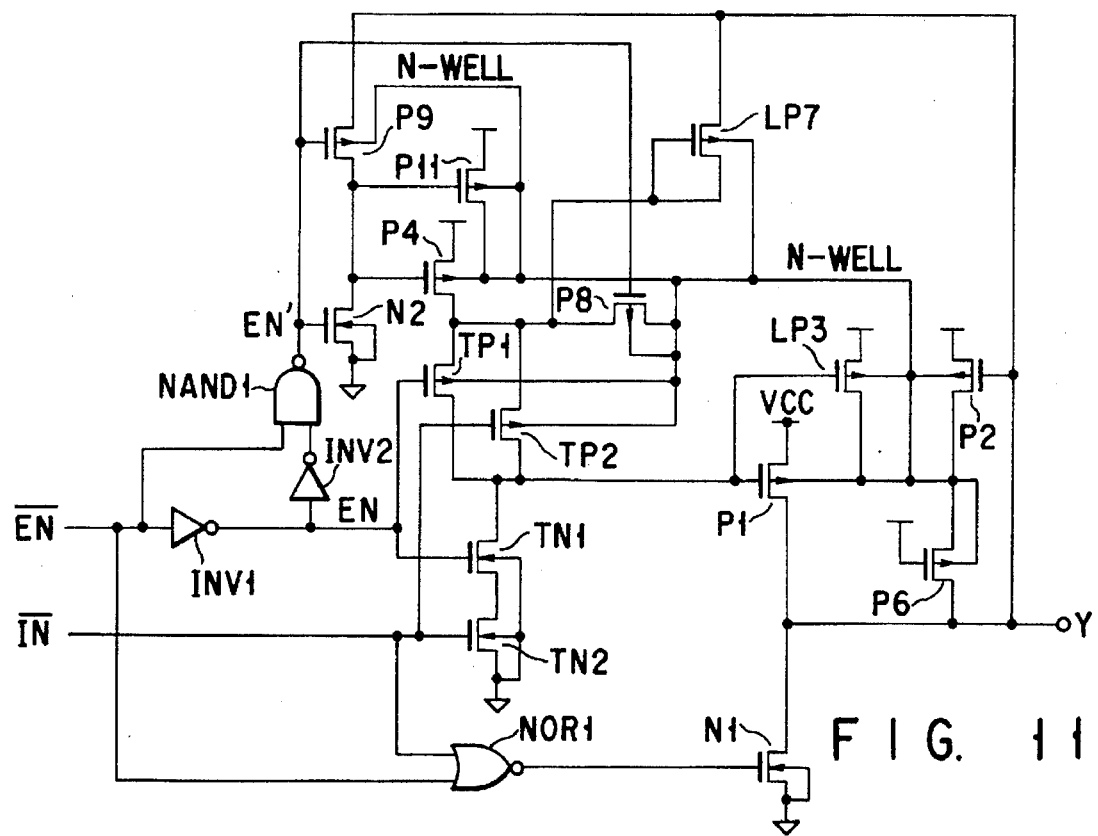
F I G. 11

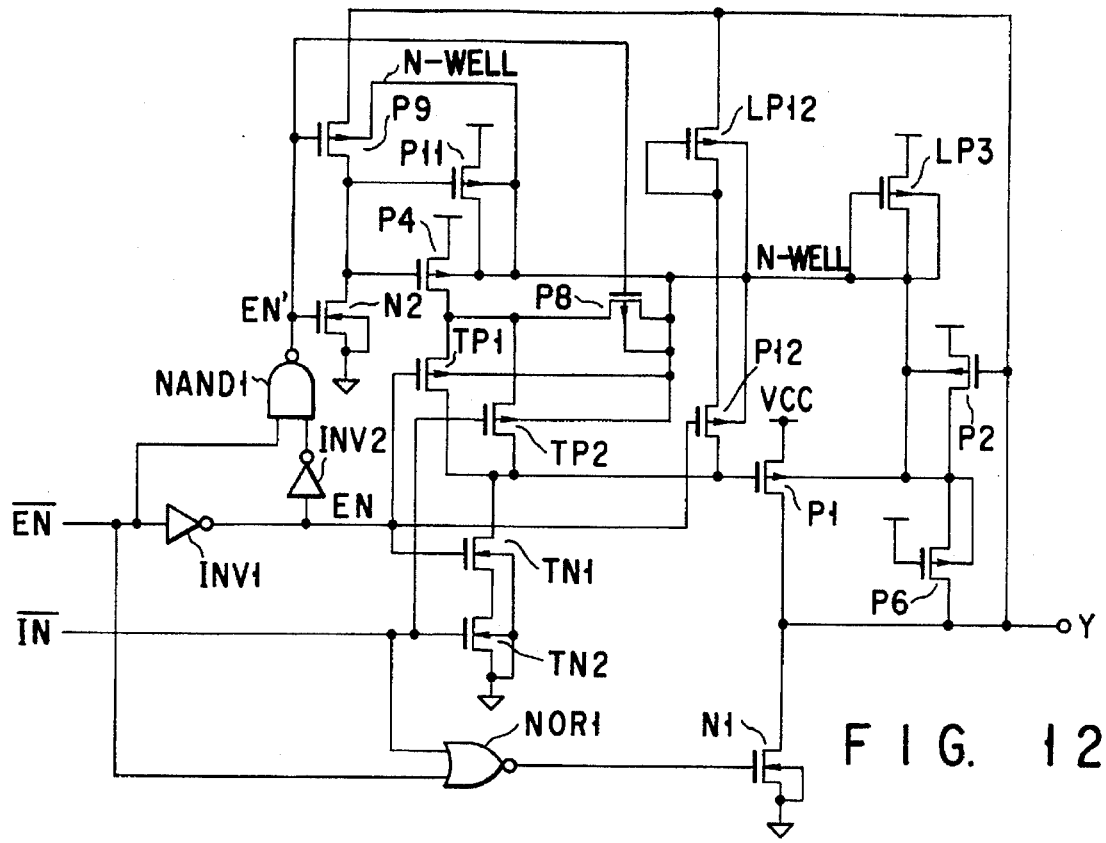
F I G. 12
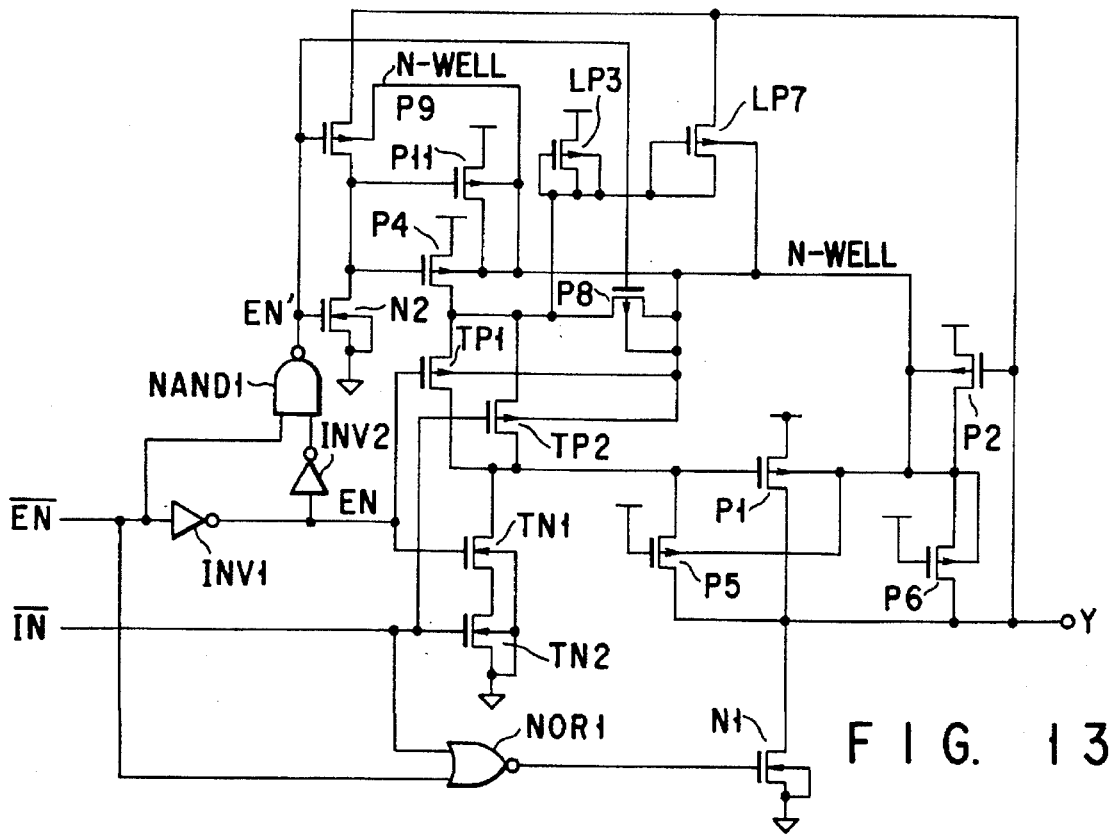
F I G. 13

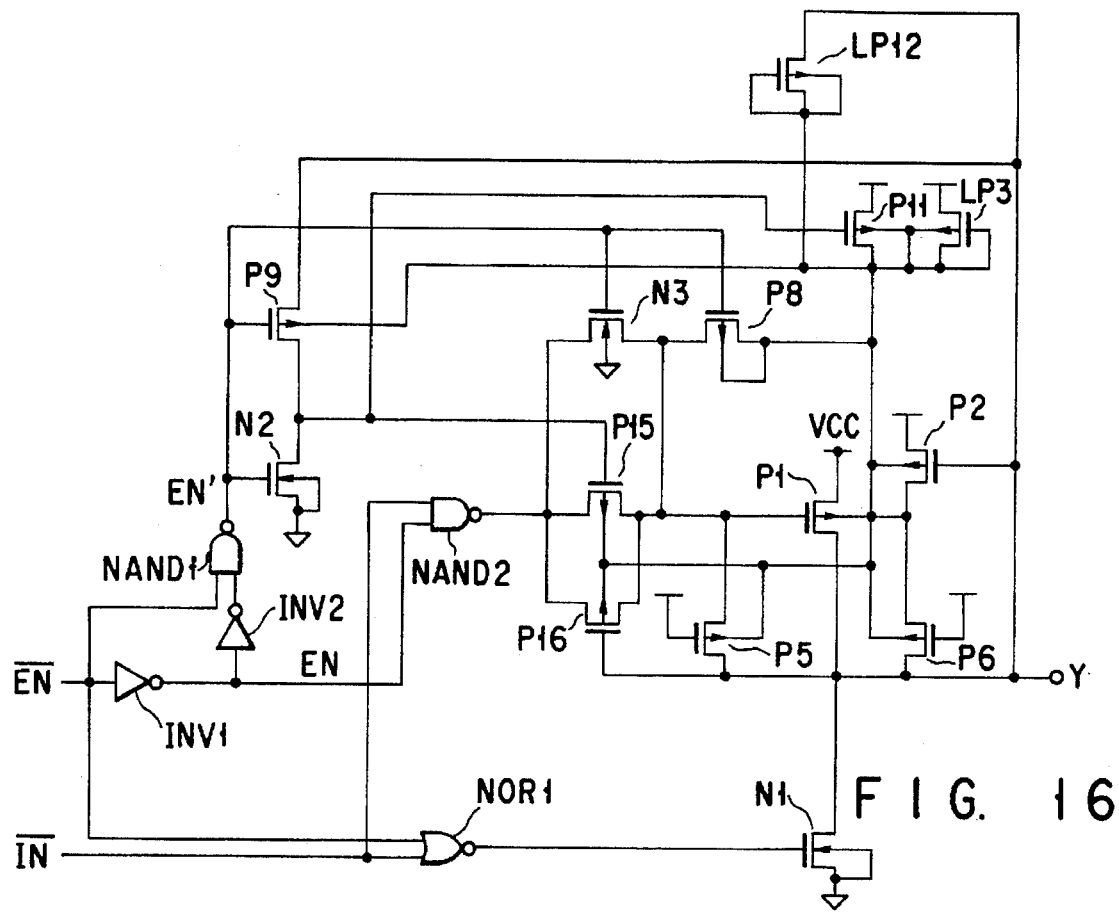
F I G. 16
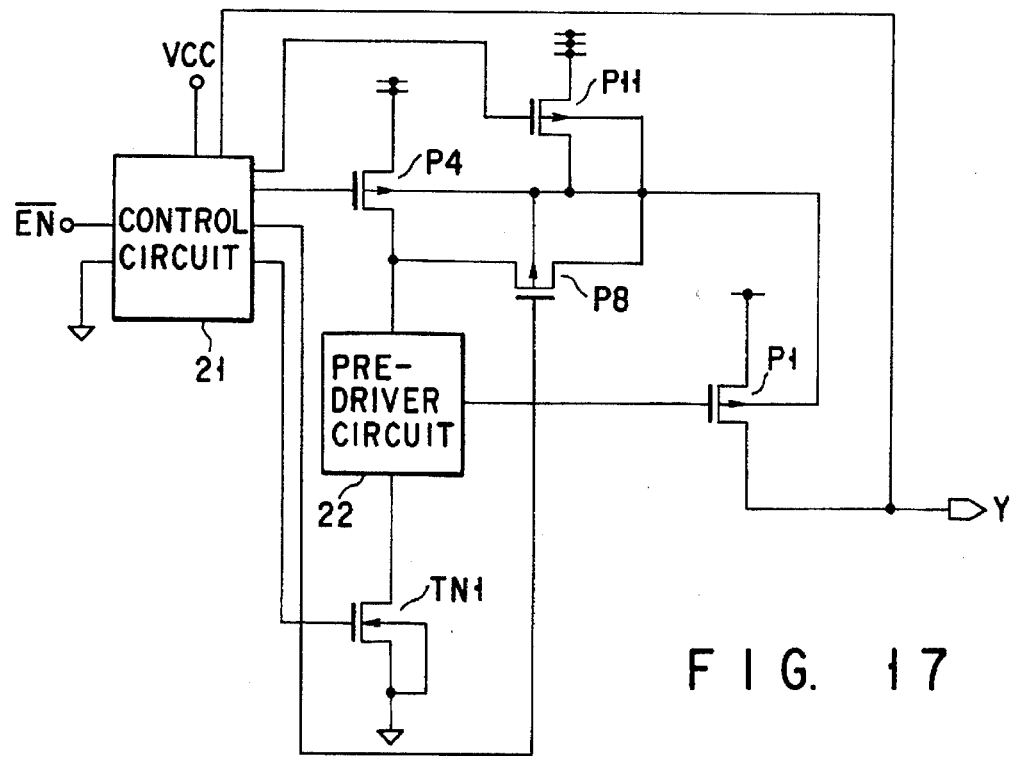
F I G. 17

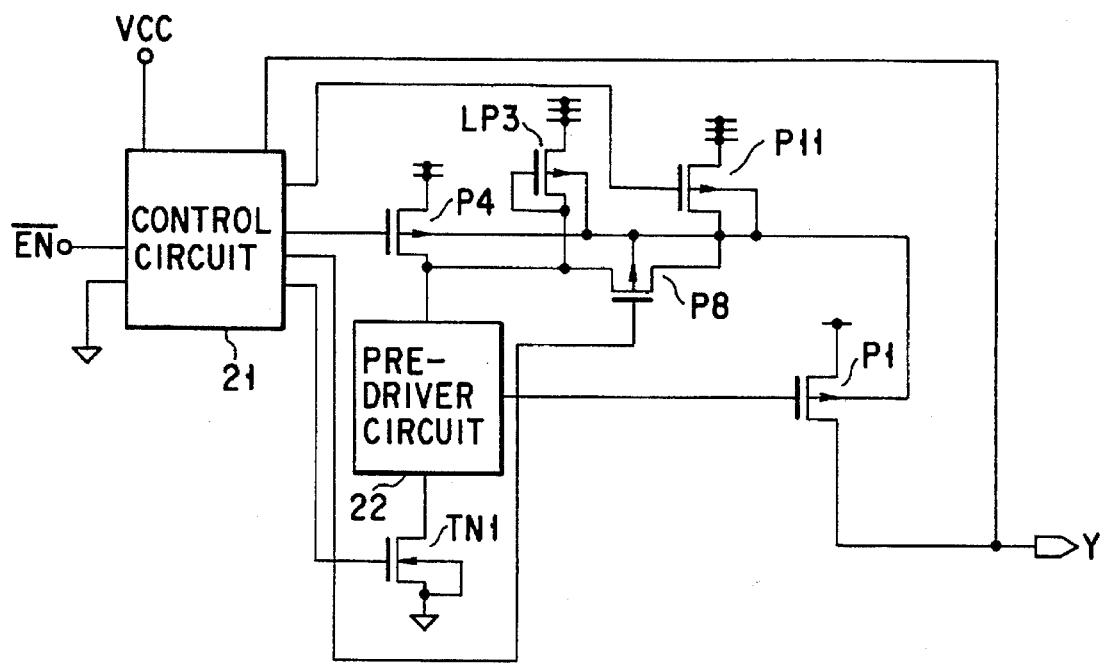
F I G. 22
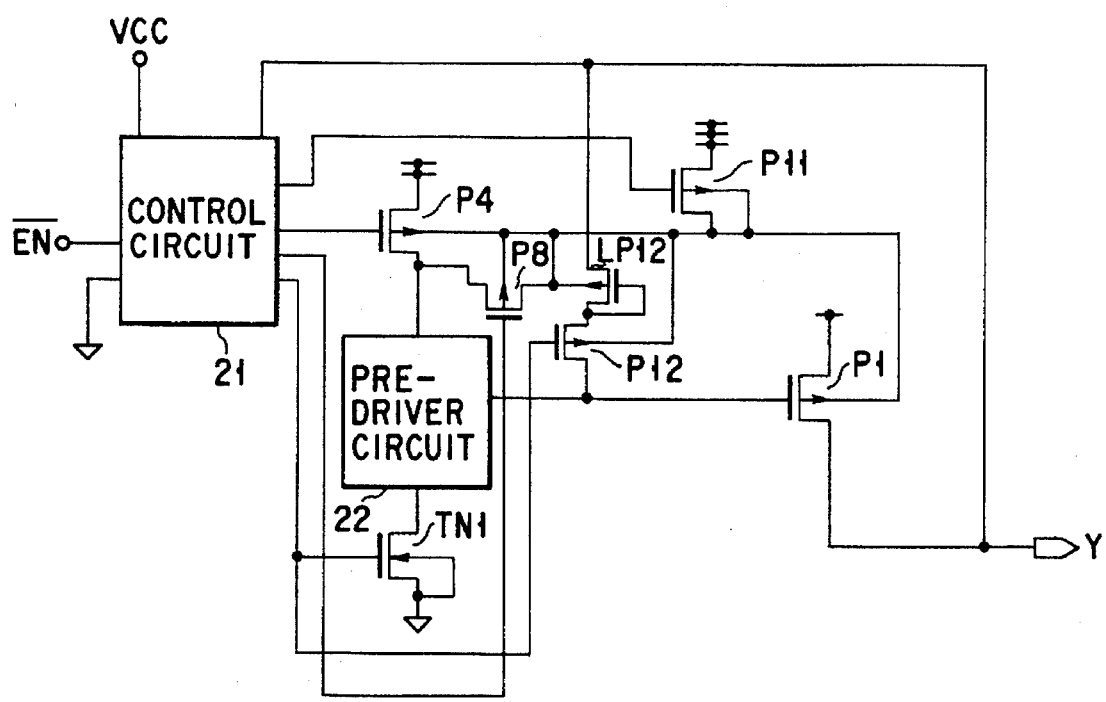
F I G. 23

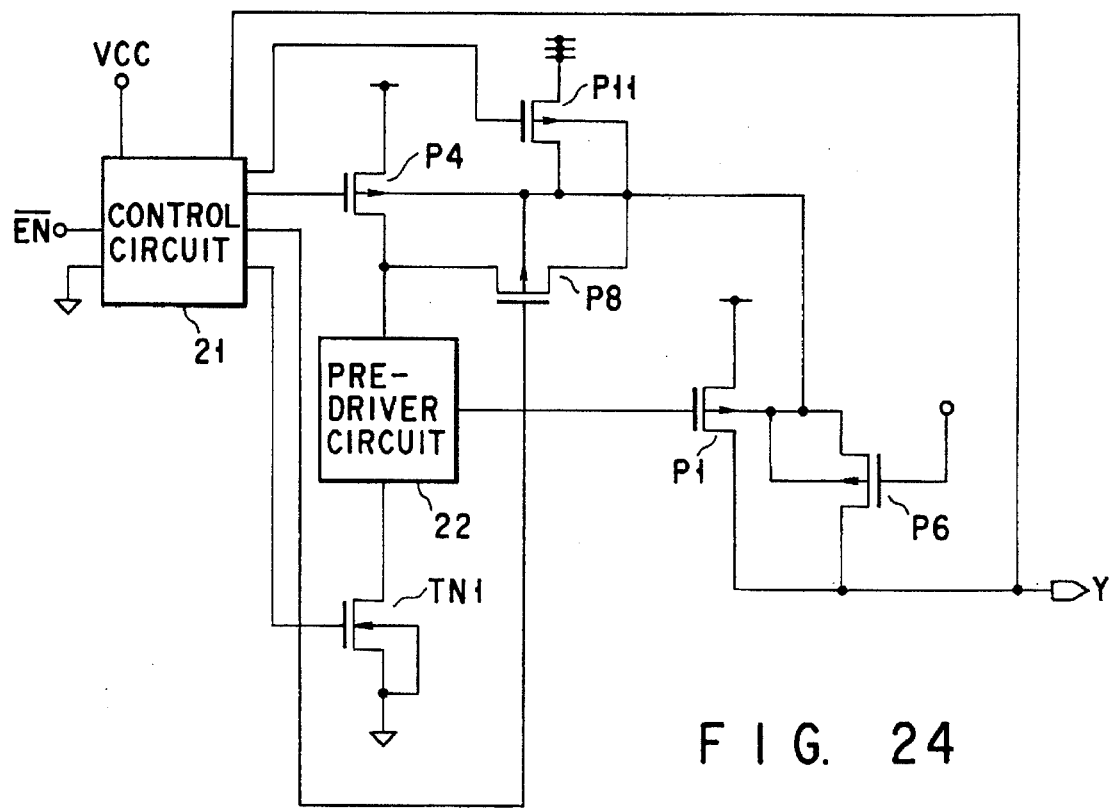
F I G. 24
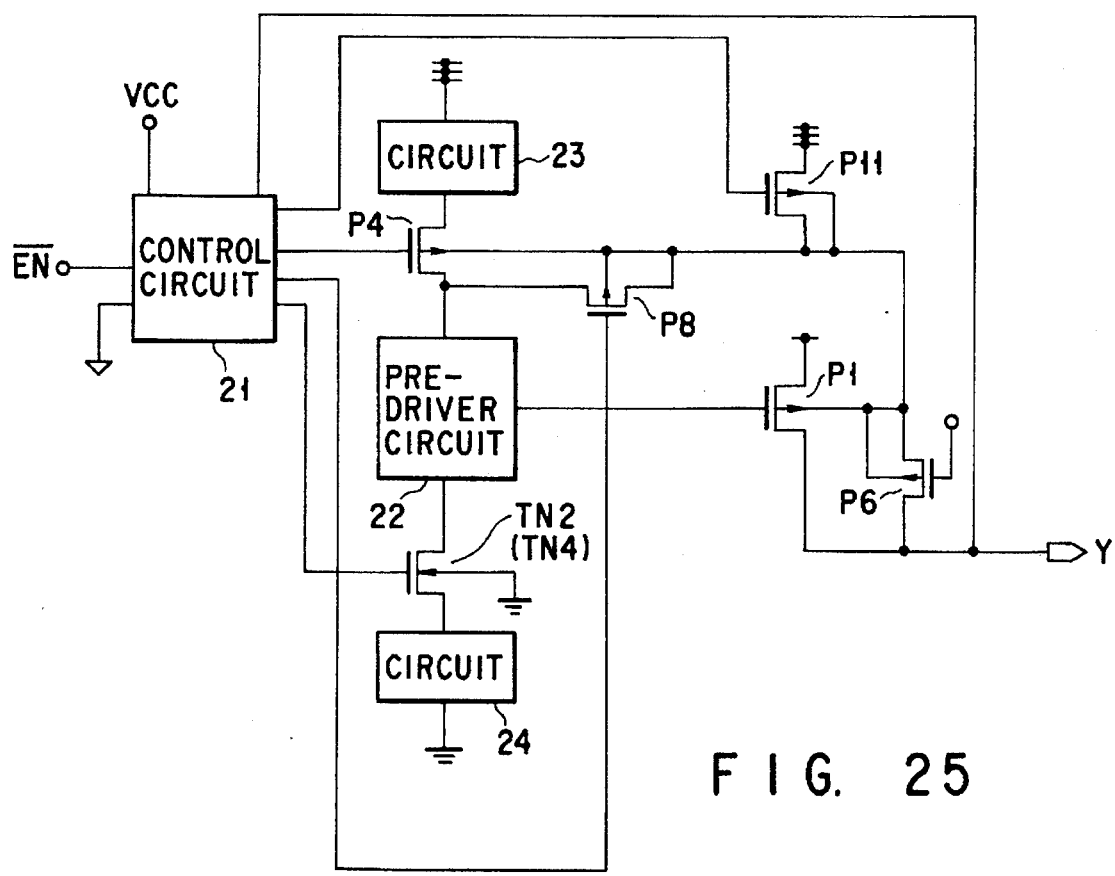
F I G. 25

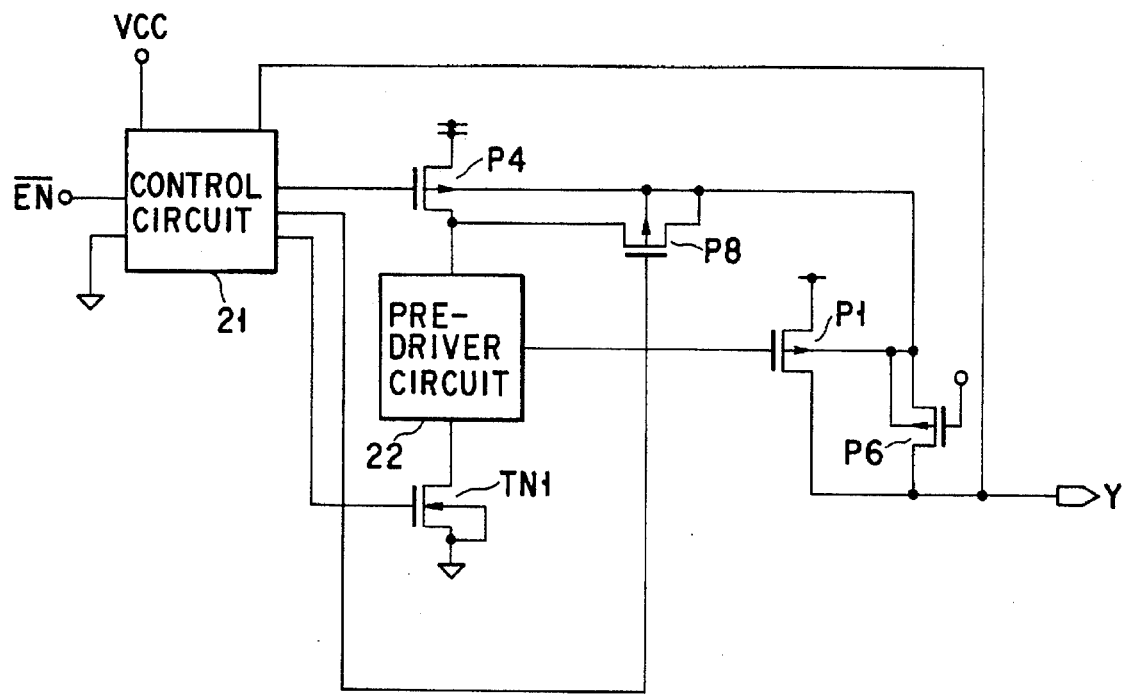
F I G. 26
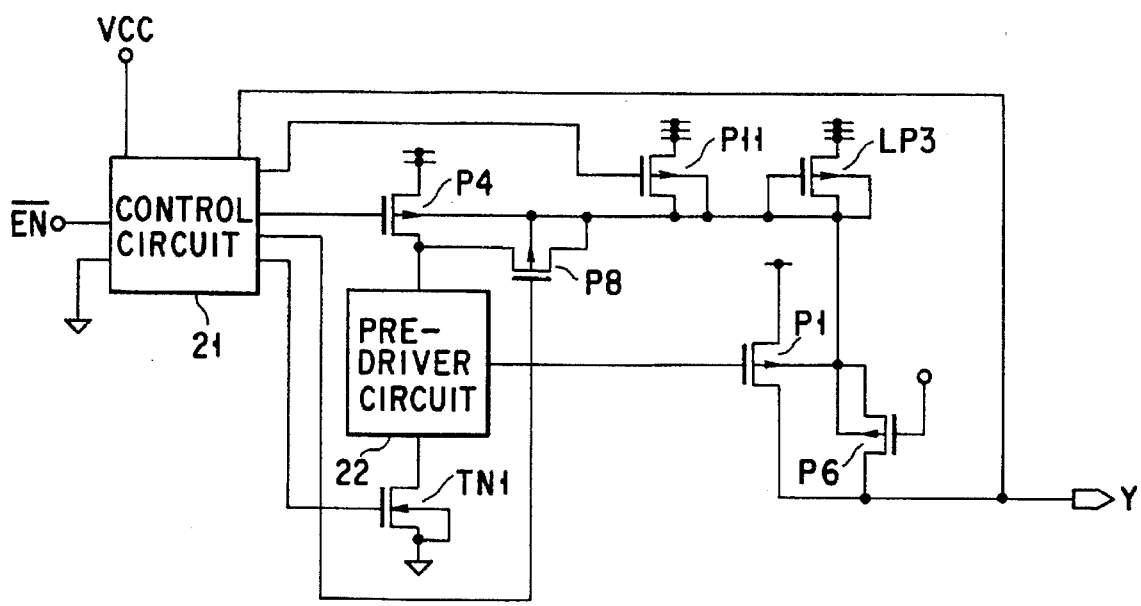
F I G. 27

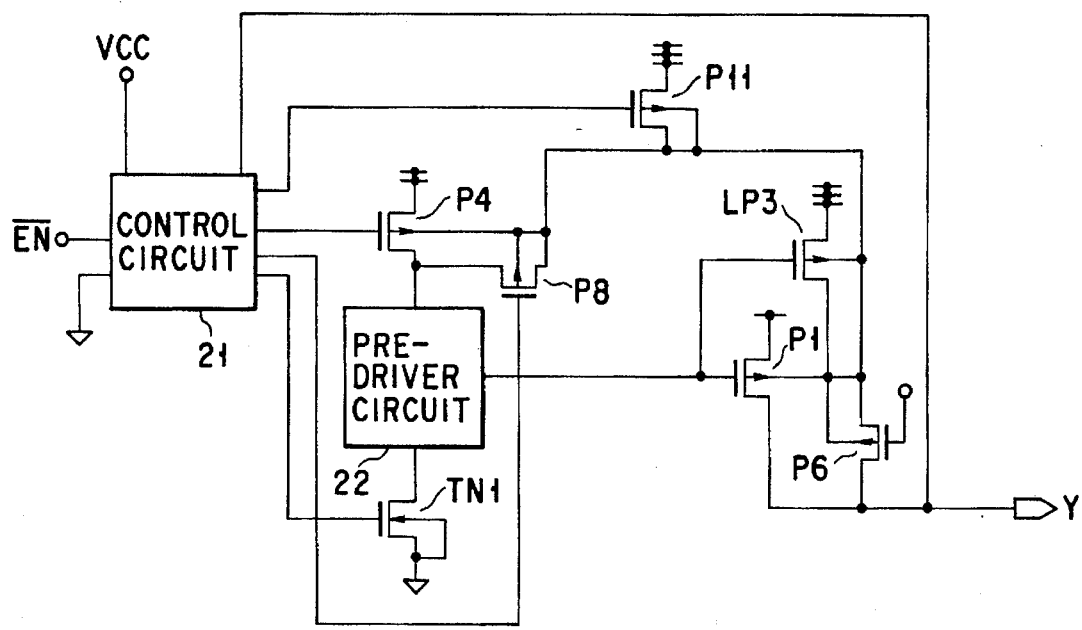
F I G. 28
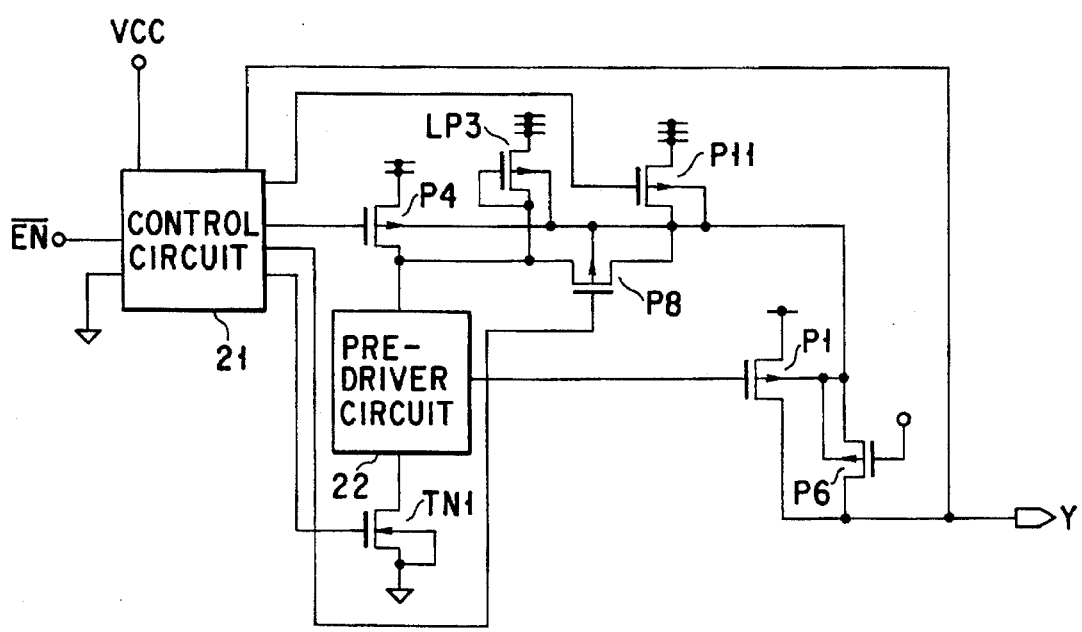
F I G. 29

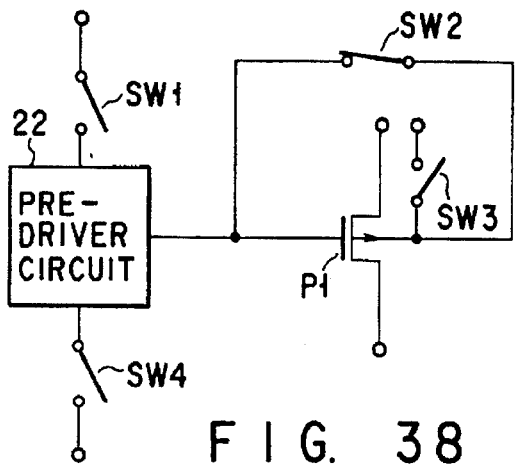
F I G. 38
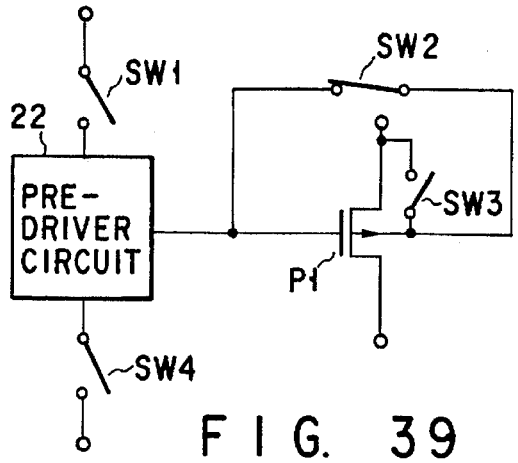
F I G. 39
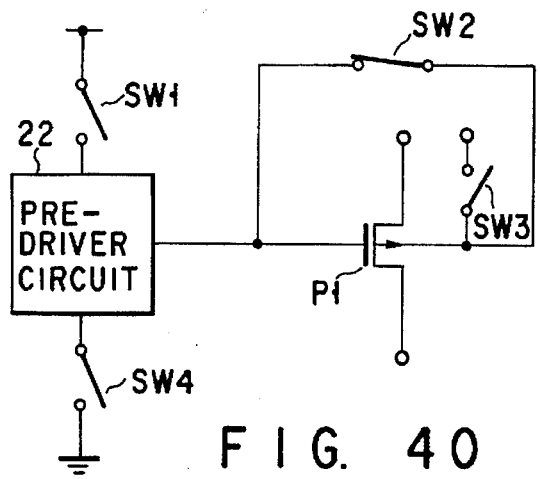
F I G. 40
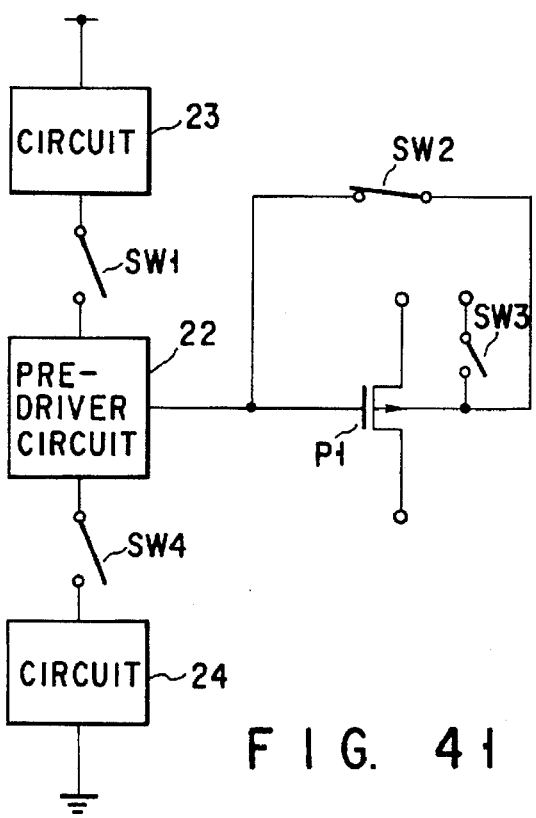
F I G. 41
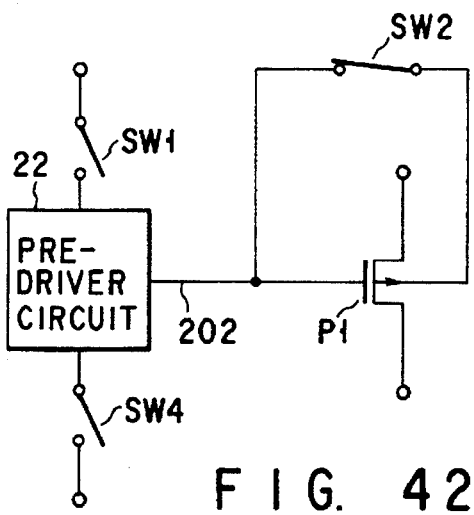
F I G. 42

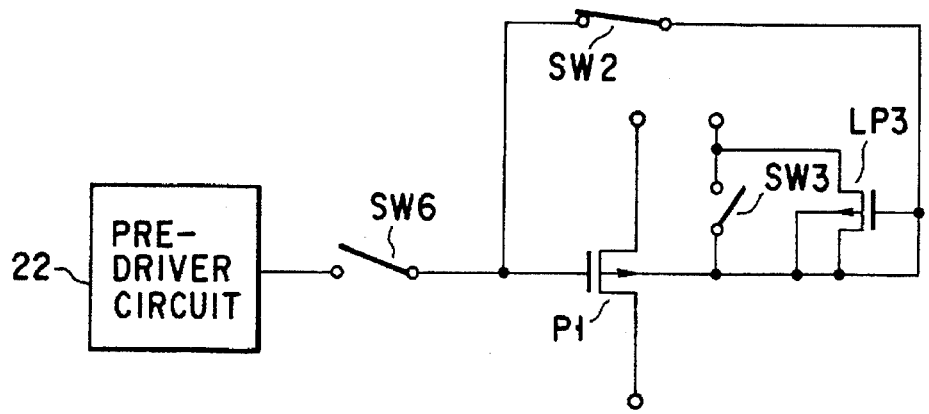
F I G. 50
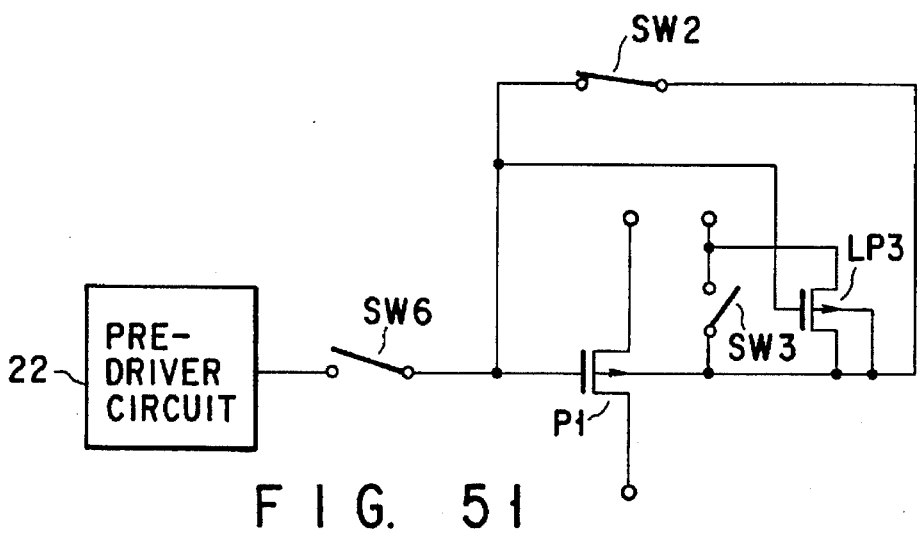
F I G. 51
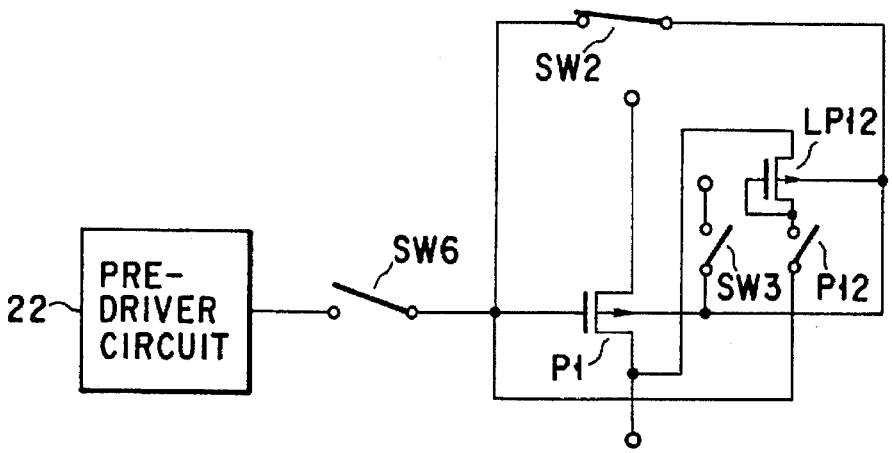
F I G. 52

OUTPUT CIRCUIT FOR USE IN A SEMICONDUCTOR INTEGRATED CIRCUIT

BACKGROUND OF THE INVENTION

1. Field of the Invention

The present invention relates to an output circuit for outputting signals, designed for use in a semiconductor integrated circuit.

2. Description of the Related Art

In electronic apparatuses such as 1-chip computers, signals are transferred through a common bus line. FIG. 1 illustrates a typical electrical connection applied in bus-line application. As shown in, FIG. 1, two tri-state buffers 501 and 502 are connected to a bus line 500. The buffers 501 and 502, which are output circuits, output one signal each. Both tri-state buffers are of CMOS structure. When the enable signals EN1 and EN2 input to them are made active, they generate from the signals IN1 and IN2 two signals, which are output to the bus line 500. When the enable signals EN1 and EN2 are inactive, the outputs of both buffers 501 and 502 are in high-impedance state. Assume that different power-supply potentials VCC1 and VCC2 are applied to the tri-state buffers 501 and 502. Either tri-state buffer has an intrinsic diode 503 which has its cathode connected to the power supply and its anode connected to the output node.

As mentioned above the tri-state buffers 501 and 502 are of CMOS structure. As shown in FIG. 2, either tri-state buffer has a P-channel MOS transistor 511 and an N-channel MOS transistor 512 in the output stage. The P-channel MOS transistor 511 receives a gate control signal generated by a NAND gate 514 supplied with an input signal IN and an output of an inverter 513 which inverts an enable signal EN. The N-channel MOSFET 512 receives a gate control signal generated by a NOR gate 515 supplied with the input signal IN and the enable signal EN. The P-type drain diffusion layer of the P-channel MOS transistor 511 and the N-type drain diffusion layer of the N-channel MOSFET 512 are connected to the output node 516 of the tri-state buffer. A pn-junction diode 517 is connected between the output node 516 and the back gate of the P-channel MOS transistor 511. This pn-Junction diode is the parasitic diode 503 shown in FIG. 1.

Assume that the tri-state buffer 502 shown in FIG. 1 outputs a high-level signal, whereas the tri-state buffer 501 is in the high-impedance state. If VCC1<VCC2-Vf, where vf is the built-in potential of the parasitic pn-Junction diode provided between the drain diffusion layer and back gate of the P-channel MOS transistor 511, the diode 503 is therefore forwardly biased. Consequently, a current I flows from the source of the potential VCC2 to the source of the power-supply potential VCC1 through the parasitic pn-Junction diode as is illustrated in FIG. 1.

To prevent the current I from flowing so, the output stage connected to the output node 516 may be constituted by exclusively N-channel MOS transistors. An output stage formed of N-channel MOS transistors only is shown in FIG. 3. This output stage of a tri-state buffer comprises two N-channel MOS transistors 518 and 512. The N-channel MOS transistor 518 receives a gate control signal generated by a NOR gate 519 supplied with an enable signal EN and an output of an inverter 513 which inverts an input signal IN. The MOS transistor 512 receives a gate control signal generated by a NOR gate 515 supplied with the input signal IN and the enable signal EN, as in the tri-state buffer shown in FIG. 2. The buffer of FIG. 3, whose output stage is made up of N-channel MOS transistors only, can output the ground potential from the output node 516. However, it cannot output the power-supply potential VCC. Its output signal level inevitably lowers by the threshold voltage of the N-channel MOS transistors.

As indicated above, if different power-supply potentials are applied to output circuits connected to a common bus line, a current unavoidably flows between the sources of the power supply potentials. To prevent this flow of a current, the output stages of the output circuits may may be constituted by exclusively N-channel MOS transistors each. If so, the output signal of each output circuit will fail to swing fully.

SUMMARY OF THE INVENTION

The object of the present invention is to provide an output circuit which can produce an output signal capable of fully swinging and which prevents a current from flowing between its power-supply potential source and the power-supply potential source of any other output circuit receiving a power-supply potential of a different value.

According to this invention, there is provided an output circuit which comprises MOS transistors each having a source, drain, a gate and a back gate isolated from the source in terms of potential, and switch means each connected between the back gate and gate of the associated MOS transistor. Since the source and back gate of each MOS transistor are isolated in terms of potential, no current will flow to the source via the pn-junction diode provided between the drain and the back gate even if a potential higher than the source potential is applied to the drain. Furthermore, the back gate is set at a potential level-shifted from the source potential by the built-in potential of the pn-junction diode. The level-shifted potential is applied to the gate through the switch means. Hence, a signal need to be externally supplied to the gate to prevent the gate from from floating in terms of potential.

According to the invention, there is provided another type of an output circuit which comprises MOS transistors each having a source, drain, a gate and a back gate isolated from the source in terms of potential, voltage-generating means each designed to generate a voltage substantially equal to the junction voltage of a pn-unction diode formed between the source and back gate of the associated MOS transistor, and switch means each connected between the output of the associated voltage-generating means and the gate of the associated MOS transistor. Each voltage-generating means, which is provided to turn off the associated MOS transistor, making it unnecessary to supply an external signal to the MOS transistor to turn it off, need not include the pn-junction diode as a component.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram showing an output circuit according to a second embodiment of the invention;

FIG. 7 is a diagram showing in detail an output circuit according to a third embodiment of the present invention;

FIG. 10 is a diagram showing in detail an output circuit according to a sixth embodiment of the present invention;

FIG. 11 is a diagram showing in detail an output circuit according to a seventh embodiment of this invention;

FIG. 12 is a circuit diagram showing an output circuit according to an eighth embodiment of the invention;

FIG. 13 is a diagram showing in detail an output circuit according to a ninth embodiment of the present invention;

FIG. 16 is a diagram showing in detail an out put circuit according to a twelfth embodiment of the present invention;

FIG. 17 is a diagram showing an identical in structure of the first embodiment shown in FIG. 4;

FIG. 22 is a diagram showing a modification of the ninth embodiment;

FIG. 23 is a diagram illustrating a modification of the eighth embodiment;

FIG. 24 is a diagram representing a further modification of the first embodiment;

FIG. 25 is a diagram showing another modification of the eleventh embodiment;

FIG. 26 is a diagram depicting still another modification of the first embodiment;

FIG. 27 is a diagram showing another modification of the fifth embodiment;

FIG. 28 is a diagram illustrating another modification of the seventh embodiment;

FIG. 29 is a diagram showing another modification of the ninth embodiment;

FIG. 38 is a diagram showing an identical in structure of the fourth embodiment; FIG. 39 is a diagram depicting a modification of the circuit shown in FIG. 39;

FIG. 40 is a diagram of a modification of the fourth embodiment;

FIG. 41 is a diagram illustrating a combination of the fourth and eleventh embodiments;

FIG. 42 is a diagram showing a modification of the the output circuit shown in FIG. 38;

FIG. 50 is a diagram showing still another modification of the output circuit shown in FIG. 47;

FIG. 51 is a diagram showing a modification of the output circuit shown in FIG. 50;

FIG. 52 is a diagram showing a modification of the output circuit shown in FIG. 49;

DETAILED DESCRIPTION OF THE PREFERRED EMBODIMENTS

Embodiments of the present invention will now be described, with reference to the accompanying drawings.

Figure 2:
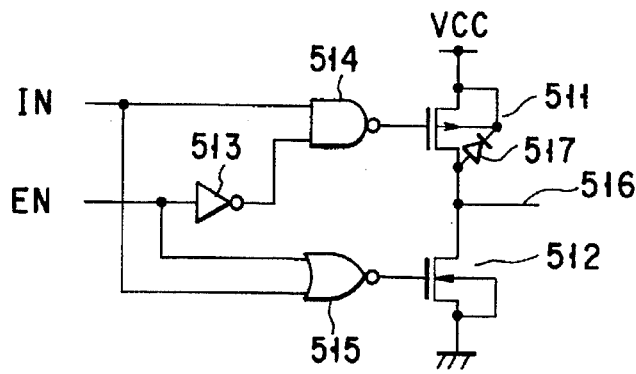
FIG. 2 is a circuit diagram of one of the identical tri-state buffers shown in FIG. 1.
Figure 3:
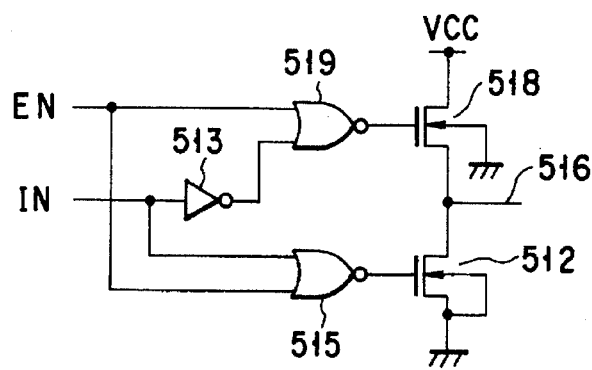
FIG. 3 is a circuit diagram showing another type of a tri-state buffer.
Figure 14:
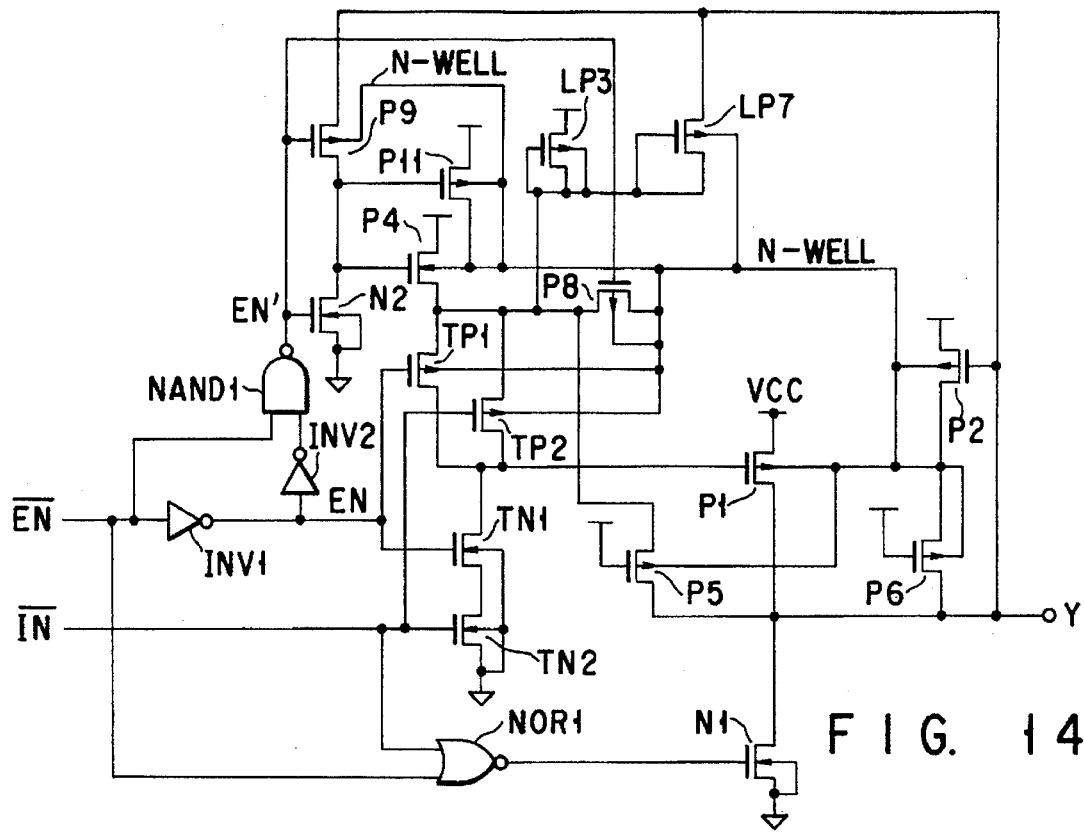
FIG. 14 is a diagram showing in detail an output circuit according to a tenth embodiment of the present invention.

FIG. 14 shows in detail an output circuit according to the first embodiment of the invention. The output circuit comprises an output stage and control signal generating means. The output stage includes a P-channel MOS (PMOS) transistor P1 and an N-channel MOS (NMOS) transistor N1 as its counterpart incorporated in the conventional output circuit of FIG. 2. The control signal generating means, designed to generate signals for controlling both MOS transistors, comprises a NAND gate, a NOR gate and an inverter, as in the output circuit of FIG. 2. The drains of the PMOS transistor P1 and NMOS transistor N1 are connected to an output terminal Y. The source of the PMOS transistor P1 is connected to a power-supply potential (VCC) node, while the source of the NMOS N1 is connected to a ground potential node.

In ordinary semiconductor devices, the source and back gate of each PMOS transistor are set at the same potential as the source. In the first embodiment, however, the source and back gate of each PMOS transistor (including the transistor P1) are isolated in terms of potential. The back gates of all PMOS transistor incorporated are connected together. The source and back gate of any NMOS transistor (including the transistor N1) are set at the same potential.

PMOS transistors TP1 and TP2 and NMOS transistors TN1 and TN2 form a NAND gate for generating a drive signal for the PMOS transistor Pi. More precisely, the sources of the PMOS transistors TP1 and TP2 are connected together, and the drains thereof are connected together. The drain node of the PMOS transistors TP1 and TP2 is connected to the gate node of the PMOS transistor Pl. The NMOS transistors TN1 and TN2 have their source-drain paths connected in series between the ground potential node and the drain node of the PMOS transistors TP1 and TP2. The gate of the PMOS transistor TP1 is connected to the gate of the NMOS transistor TN1. This gate node of the transistors TP1 and TN1 receives an enable signal EN output from an inverter INV1. The gates of the PMOS transistor TP2 is connected to the gate of the NMOS transistor TN2. The gate node of the transistors TP2 and TN2 receives an input signal /IN. A NOR gate NOR1 is provided to generate a gate-drive signal for the NMOS transistor N1 and receives the enable signal /EN and the input signal /IN.

Connected to the back gate of the PMOS transistor P1 are the drain and back gate of the PMOS transistor P2. The source and gate of the PMOS transistor P2 are connected to the power-supply potential node and to the output terminal Y, respectively. The source node of the PMOS transistors TP1 and TP2 is connected to the drain of a PMOS transistor P4. The source of the PMOS transistor P4 is connected to the power-supply potential node. The source-drain path of a PMOS transistor P6 is connected between the back gate of the PMOS transistor P1 and the output terminal Y. The gate of the PMOS transistor P6 is connected to the power-supply potential node.

Figure 4:
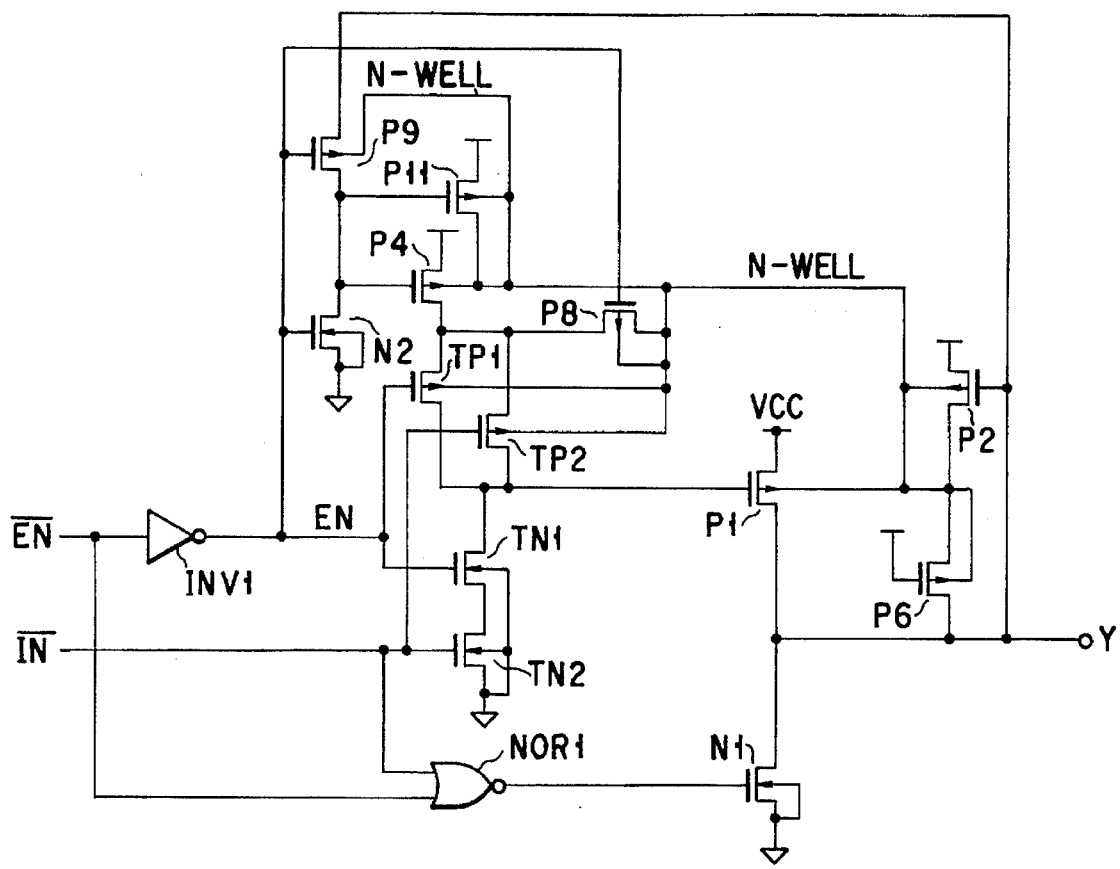
FIG. 4 is a circuit diagram showing an output circuit according to a first embodiment of the invention.

The output circuit shown in FIG. 4 further comprises a PMOS transistor P9 and an NMOS transistor N2. These transistors P9 and N2 are provided for generating a control signal based on the output EN of the inverter INV1, the ground potential, and the potential at the output terminal Y. The source of the PMOS transistor P9 is connected to the output terminal Y. The PMOS transistor P9 and the NMOS transistor N2 have their drains connected together and their gates connected together. The source of the NMOS transistor N2 is connected to the ground potential node.

Further, the output circuit shown in FIG. 4 comprises PMOS transistors P8 and P11. The PMOS transistor P8 has its source-drain path connected between the back gate of the PMOS transistor P1 and the drain of the PMOS transistor P4. The PMOS transistor P11 has its source-drain path connected between the power-supply potential node and the back gate of the PMOS transistor P1. The signal output at the drain node common to the PMOS transistor P9 and the NMOS transistor N2 is supplied to the gates of the PMOS transistors P4 and P11. The signal EN is supplied to the gate of the PMOS transistor P8.

Figure 5:
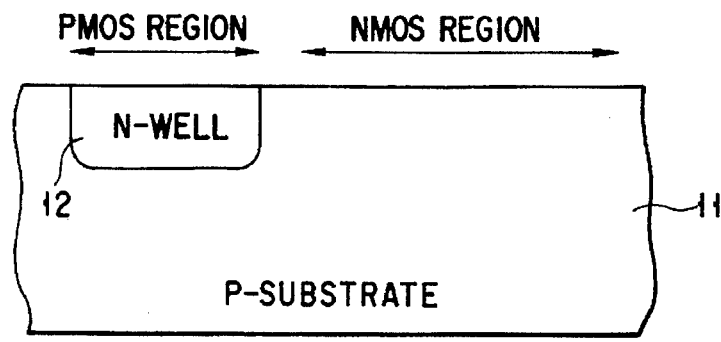
FIG. 5 is a sectional view of the substrate in which the circuit of FIG. 4 is formed.

Generally, an NMOS transistor is formed in a P-type substrate, and a PMOS transistor in an N-type substrate. A P-type substrate 11 is used, as shown in FIG. 5, to form the output circuit shown in FIG. 4 in one and the same substrate, in the form of an integrated circuit. The PMOS transistors described above are formed in an N-type well (N-WELL) 12 provided in the P-type substrate 11. As indicated above, a potential higher than the power-supply potential VCC may be applied to the output terminal Y. Therefore it is impossible to use an N-type substrate. Were an N-type substrate used, a P-type diffusion layer should be formed in the substrate. This layer would function as the drain of each PMOS transistor, inevitably forming an intrinsic pn-junction diode between the drain and the substrate. Such a pn-junction diode would be biased forwards, and an unnecessary current would flow through the pn-junction diode.

In FIG. 4, the symbol "N-WELL" is used to indicate that the PMOS transistors P1, P2, P4, P6, P8, P9, P11, TP1 and TP2 are formed in the same N-type well. Nonetheless, the PMOS transistors need not be formed in one N-type well. Rather, they may be formed in different N-type wells which are electrically connected to one another. Furthermore, the back gates of the PMOS transistors TP1 and TP2 may be connected to the drain of the PMOS transistor P4.

The operation of the output circuit shown in FIG. 4 will be explained below. In the following explanation, the power-supply potential VCC level, the ground potential, and the threshold voltage Vtp (Px) (where x is 1, 2, . . . ) will be referred to as "H level," "L level," and "Vtp (Px) (x=1, 2, . . . )," respectively.

While the enable signal /EN is set at the L level, thus enabling the output circuit, the PMOS transistor P1 or the NMOS transistor N1 of the output stage is turned on. Which transistor, P1 or N1, is turned on depends on the level of the input signal/IN. As a result, the output terminal Y is set at either the H level or the L level. Since the enable signal /EN is at the L level, the output of the inverter INV1 is at the H level. The NMOS transistor N2 is therefore turned on, whereas the PMOS transistor P9 is turned off. The gate node of the PMOS transistor P4 and P11 is thereby set at the L level, and the PMOS transistors P4 and P11 are turned on. The back rates NWELL of the PMOS transistors P4 and P11 are pulled up to the VCC level. So is the source node of the PMOS transistors TP1 and TP2. Since the PMOS transistor P8 is off in this condition, the NAND gate comprised of the PMOS transistors TP1 and TP2 and the NMOS transistors TN1 and TN2 is rendered operative. In short, the output circuit of FIG. 4 operates in the same way as an ordinary tri-state buffer when it is enabled.

Figure 1:
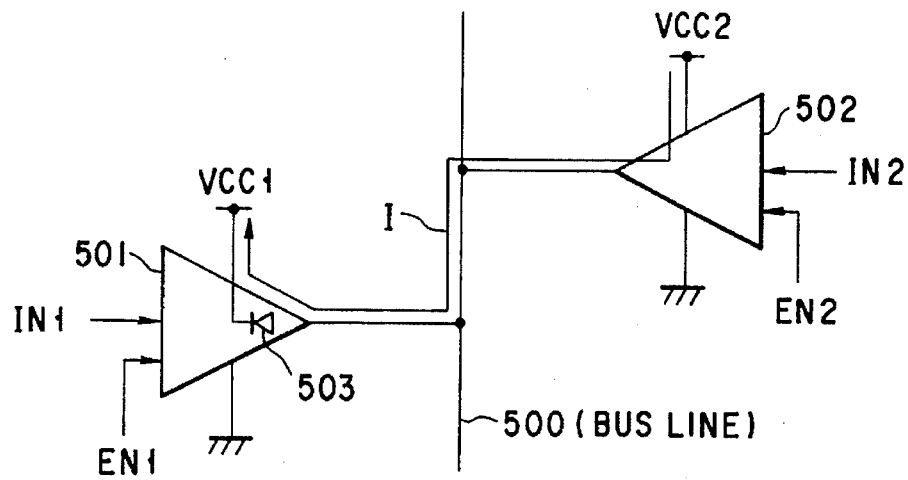
FIG. 1 is a circuit diagram illustrating a typical electrical connection applied in bus-line application.

How the output circuit operates when disabled will be explained below. As long as the circuit is disabled, the output terminal Y assumes a high-impedance state, regardless of the level of the input signal/IN. Since the enable signal /EN is at the H level, the output of the NOR Gate NOR1 is at the L level. The NMOS transistor N1 is turned off. Assume that the output circuit is connected to a bus line in the same fashion as illustrated in FIG. 1. Then, the output terminal Y can assume three states—the first state in which the terminal Y is set at the L level; the second state in which the terminal Y is set at the H level; and the third state in which the terminal Y is set at a level higher than the VCC level.

When the output terminal Y assumes in the first state— that is, when it is set at the L level, the output at the terminal Y turns on the PMOS transistor P2. The back gate of the PMOS transistor P2 is pulled up to the VCC level. Since the signal EN is at the L level, the NMOS transistor N2 is off, whereas the PMOS transistors P8 and P9 are on. The potential of the output terminal Y is applied via the PMOS transistor P9 to the gate node of the PMOS transistors P4 and P11. The potential at this gate node therefore has a value intermediate between the VCC level and the ground potential. Depending on the value of this potential, the PMOS transistors P4 and P11 may be turned on. Since the PMOS transistor P8 is on, too, the potential of its back gate NWELL is reliably applied to the source node of the PMOS transistors TP1 and P2. Hence, the NAND gate comprised of the PMOS transistors TP1 and TP2 and the NMOS transistors TN1 and TN2 becomes operable. Since the signals /EN and EN are now at the H level and the L level, respectively. The PMOS transistor TP1 is turned on, and the gate node of the PMOS transistor P1 is pulled up to the VCC level. The PMOS transistor P1 is thereby turned off. Since the signal /EN and the output of the NOR gate NOR1 are at the H level and the L level, respectively, the NMOS transistor N1 is also off. Therefore, the output terminal Y is held in the high-impedance state.

When the output terminal Y assumes in the second state—that is, when it is set at the H level, the NMOS transistor N2 is turned off, while the PMOS transistors P8 and P9 are turned on. The signal at the output terminal Y is supplied through the PMOS transistor P9 to the gate node of the PMOS transistors P4 and P11. The potential at the gate node is therefore at the VCC level. The PMOS transistors P4 and P11 are therefore turned off. The PMOS transistor P2 is also turned off by the signal at the output terminal Y, which is at the H level. At this time, the potential of the back gate of the PMOS transistor P1 is (VCC−Vf), where VCC is the source potential of the PMOS transistor P1 and Vf is the built-in potential of the parasitic pn-junction diode formed between the source and back gate of the PMOS transistor P1. The potential of (VCC−Vf) is applied to the source node of the PMOS transistors TP1 and TP2 since the PMOS transistor P8 is on. The PMOS transistor TP1 is on since the signal EN is at the L level. Thus, the potential (VCC−Vf) is applied also to the gate node of the PMOS transistor P1. When Vtp(P1) >Vf, a current flows through the PMOS transistor P1. This current can be sufficiently reduced by setting Vtp(P1) is less than −Vf, and the output terminal Y can be considered to assume a high-impedance state.

When the output terminal Y assumes in the third state—that is, when it is set at a level Vy higher than the VCC level, a large current flows between the power-supply sources in the conventional output circuit. In the circuit of FIG. 4, the PMOS transistor P6 is turned on if Vy>VCC+|Vtp(P6)|. This is because the output terminal Y is set at a potential higher than the VCC level. The potential of the back gate NWELL of the PMOS transistor P6 becomes equal to the potential at the output terminal Y. The potential of the back gate NWELL is applied via the PMOS transistor P8 to the drain of the PMOS transistor P4, and via the PMOS transistor TP1 to the gate node of the PMOS transistor P1. Since the signal EN is at the low level, the NMOS transistor N2 is turned off, while the PMOS transistors P8 and P9 are turned on. The potential at the output terminal Y is applied through the PMOS transistor P9 to the gate node of the PMOS transistors P4 and P11. As a result, PMOS transistors P1, P2, P4 and P11 have their gate-source voltages changed to zero and are turned off. In this case, too, the output terminal Y is held in the high-impedance state.

As described above, the potential of the output terminal Y can swing fully, from the Ground level to the power-supply level VCC when the output circuit is in the enabled state. When the output circuit is in the disabled state, no current flows from the output terminal Y to the power-supply node even if the terminal Y is set at a potential higher than the power-supply potential VCC, or from the power-supply node to the output terminal Y even if the output terminal Y is set at a potential equal to or lower than the power-supply potential VCC. In short, the output terminal Y can remain in the high-impedance state.

An output circuit according to the second embodiment of the invention will now be described, with reference to FIG. 6.

The circuit shown in FIG. 4 and described above is enabled and outputs a signal Y at the H level when the enable signal /EN is at the L level. It is disabled and outputs a signal at the H level when the enable signal /EN is at the H level. Since the output signal Y is at the H level when the circuit is enabled, the gate node of the PMOS transistor P1 is set at the L level. When the circuit is disabled, the gate node of the PMOS transistor P1 must be set at the H level so as to be turned off. Since the output signal Y is set at the H level when the circuit is disabled, however, the gate node of the PMOS transistors P4 and P11 is pulled up to the H level by the PMOS transistor P9. In other words, the PMOS transistors P4 and P11 are quickly turned off. The gate node of the PMOS transistor P1 is thereby pulled up to the potential of (VCC−Vf) by the PMOS transistors P8 and TP1. As mentioned above, this potential is generated when a current flows through the parasitic pn-junction diode formed between the source and back gate of the PMOS transistor P1. This current corresponds to a base current of a parasitic bipolar transistor whose emitter is the power-potential node (VCC), whose base is the back gate NWELL, and whose collector is the P-type substrate 11. That is, an emitter-collector current of this bipolar transistor flows in the P-type substrate. It is possible that the emitter-collector current becomes a trigger current, which may cause latch-up.

The output circuit according to the second embodiment is designed to prevent such latch-up. It differs from the output circuit of FIG. 4 in two respects. First, it has an inverter INV2 for inverting the output of the inverter INV1 and a signal-delaying circuit comprising a NAND gate NAND1 receiving the output of the inverter INV2 and the enable signal /EN. Secondly, the output of the signal-delaying circuit is supplied, instead of the output of the inverter INV1, to the gate node of the NMOS transistor N2 and the PMOS transistor P9 and also to the gate of the PMOS transistor P8.

In the output circuit shown in FIG. 6, when the enable signal /EN changes from the L level to the H level, the output signal EN of the inverter INV1 changes from the H level to the L level, turning off the NMOS transistor TN1 and turning on the PMOS transistor TP1. At this time, the output EN' of the NAND gate NAND1 is still at the H level, the PMOS transistors P4 and P11 are on, and the PMOS transistor P8 is off. This is because the inverter INV2 and the NAND gate NAND1 have a gate delay time. The gate delay time is equal to the time which the PMOS transistor P4 requires to pull up the gate-node potential of the PMOS transistor P1 from the L level to the H level. Therefore, no current flows through the parasitic pn-junction diode described above. Upon lapse of the gate delay time, the PMOS transistors P8 and P9 are turned on, and the NMOS transistor N2 is turned off.

Conversely, when the enable signal /EN changes from the H level to the L level, the output signal EN of the inverter INV1 changes from the L level to the H level. In this case, the NMOS transistor TN1 is turned on, and the PMOS transistor TP1 is turned off. The output EN' of the NAND gate NAND1 changes from the L level to the H level almost at the same time the signal EN changes from the L level to the H level, since the enable signal /EN is input to the NAND gate NAND1. Hence, the NMOS transistor N2 is turned on, and the PMOS transistors P8 and P9 are turned off. Subsequently, the PMOS transistors P4 and P11 are turned on. The NAND gate NAND1, which comprises the PMOS transistors TP1 and TP2 and NMOS transistors TN1 and TN2, becomes operative and can receive the input signal /IN.

FIG. 7 is a diagram showing in detail an output circuit according to the third embodiment of this invention. Like the circuit of FIG. 6 (the second embodiment), this circuit is designed to prevent latch-up. The circuit according to the third embodiment differs from the circuit of FIG. 6 in that the signal-delaying circuit is constituted by two inverters INV2 and INV3, not by the inverter INV2 and the NAND gate NAND1. The inverter INV2 inverts the output EN of the inverter INV1, and the inverter INV3 inverts the output of the inverter INV2, producing the signal EN'.

The output circuit shown in FIG. 7 operates in the same way as the output circuit of FIG. 6 when the enable signal /EN changes from the L level to the H level. When the enable signal /EN changes from the H level to the L level, the signal EN' changes from the L level to the H level, delayed with respect to the signal EN by the sum of the signal-transfer time of the inverter INV2 and that of the inverter INV3. The NAND gate, which comprises the PMOS transistors TP1 and TP2 and NMOS transistors TN1 and TN2, becomes operative and able to receive the input signal /IN, upon lapse of the total signal-transfer time of the two inverters INV2 and INV3.

In the first, second and third embodiments described above, the PMOS transistor P8 is connected at one end to the drain of the PMOS transistor P4 in order to apply the potential of the back gate of the PMOS transistor P1 to the gate thereof. Instead, the PMOS transistor P8 may have its one end connected directly to the gate of the PMOS transistor P1 as in the output circuit shown in FIG. 8 (i.e., the fourth embodiment of the present invention). In the fourth embodiment, the gate node of PMOS transistor P8 is pulled down to the L level when the enable signal /EN changes from the H level to the L level while the input signal /IN remains at the H level. If the PMOS transistor P8 is turned off slowly, however, a DC current may temporarily flow from the power-supply potential node to the ground potential node via the PMOS transistor P8. The signal-delaying circuit incorporated in this output circuit is constituted by an inverter INV2 and a NAND gate NAND1. Alternatively, the signal-delaying circuit may be comprised of two inverters INV2 and INV3 as in the output circuit shown in FIG. 7.

An output circuit according to the fifth embodiment of the invention will now be described, with reference to FIG. 9.

In the second embodiment (FIG. 6), the PMOS transistor P2 is off if the potential Vy of the output terminal Y is higher than VCC−|Vtp(P2)| and lower than VCC while the enable signal /EN remains at the H level, thus disabling the output circuit. In this condition, the back gate NWELL of the PMOS transistor P2 is pulled up to at least (VCC−Vf) by the parasitic pn-junction diode. Since the PMOS transistors P8 and TP1 are on, the gate of the PMOS transistor P1 is set at the potential of (VCC−Vf). If −Vf is lower than Vtp(P1), the PMOS transistor P1 is turned on, and a current may flow through the source-drain path of the PMOS transistor P1.

The PMOS transistor P6 if the potential Vy of the output terminal Y is higher than VCC and lower than VCC+|Vtp(P6)|. In this case, the back gate NWELL of the PMOS transistor P6 is pulled up to at least (Vy−Vf) by the parasitic pn-junction diode. Since the PMOS transistors P8 and TP1 are on, the gate of he PMOS transistor P1 is set at the potential of (Vy−Vf). If −Vf is lower than Vtp(P1), the PMOS transistor P1 is turned on, and a current may flow through the sourcedrain path of the PMOS transistor P1.

Figure 9:
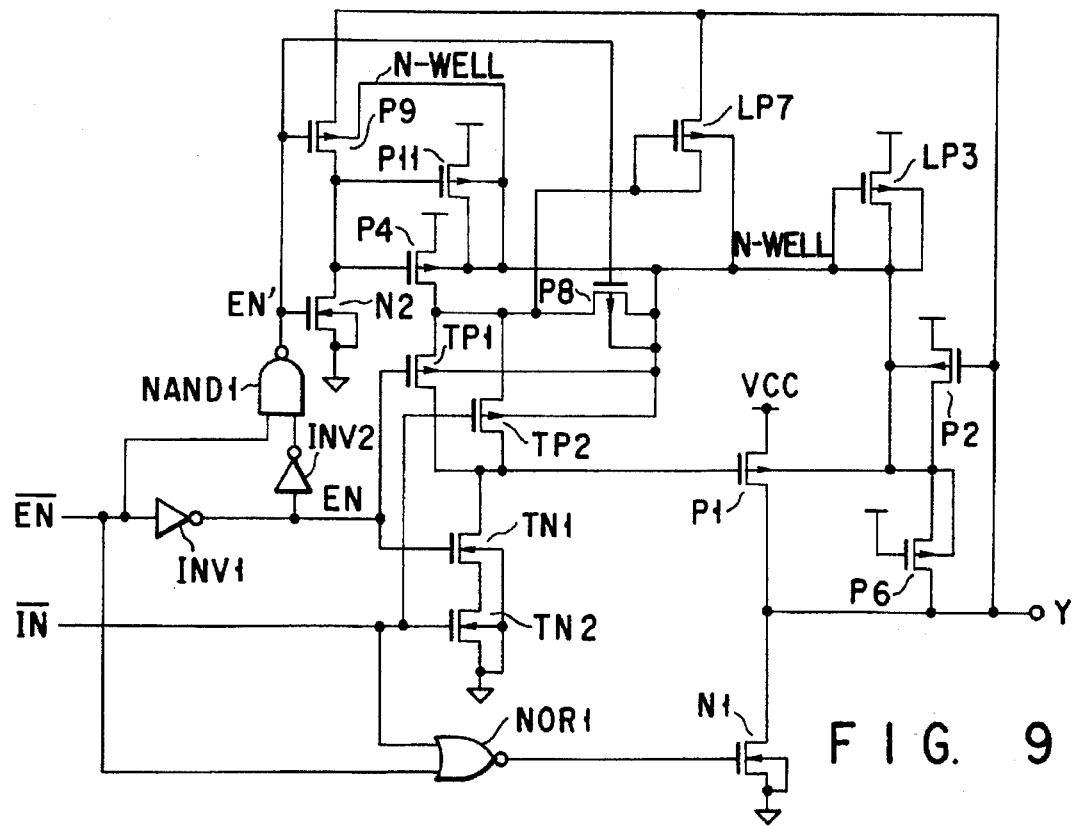
FIG. 9 is a circuit diagram illustrating an output circuit according to a fifth embodiment of the present invention.

The output circuit shown in FIG. 9 is designed to minimize the current flowing through the PMOS transistor P1, by virtue of the potential of the output terminal Y. The circuit differs from the circuit of FIG. 6 in that two additional PMOS transistors LP3 and LP7 are used. The PMOS transistor LP3 has a threshold voltage Vtp(LP3) which is equal to or higher than Vtp(P1). That is, Vtp(P1)≦Vtp(PL3). The PMOS transistor LP3 has its source connected to the power-supply potential node, and its drain, gate and back gate to the back gate NWELL. The PMOS transistor LP7 has a threshold voltage Vtp(PL7) which is equal to or higher than Vtp(P1). That is, Vtp(P1)≦Vtp(PL7). The PMOS transistor PL7 has its source connected to the output terminal Y, and its drain and gate to the drain of the PMOS transistor P4, and its back gate to the back gate NWELL.

If the potential Vy of the output terminal Y is higher than VCC−|vtp(P2)| and lower than VCC, that is, VCC−|vp(P2)|<Vy<VCC, while the enable signal /EN remains at the H level, thus disabling the output circuit, the back gate NWELL of the PMOS transistors P1 and P2 will be pulled up to (VCC−Vf). Since Vtp(P1)≦Vtp(LP3), the potential V(NWELL) of the back gate NWELL can be made to have the relation of: VCC−|Vtp(LP3)|≦V(NWELL)<VCC. The gate node of the PMOS transistor P1 is at the same potential as the potential V(NWELL) because the PMOS transistors P8 and TP1 are on. The gate-source voltage Vgs(P1) of the PMOS transistor P1 therefore becomes equal to Vtp(LP3). As a result, the PMOS transistor P1 operates in its sub-threshold region at all times, and the current flowing through the PMOS transistor P1 is greatly reduced.

If the potential Vy of the output terminal Y is higher than VCC and lower than VCC+|Vtp(P6)|, that is, VCC<Vy<VCC+|Vtp(P6)|, while the output circuit remains disabled, the back gate NWELL of the PMOS transistor P6 will be pulled up to at least (Vy−Vf). In this case, Vtp(P1)≦Vtp(LP7), and the potential V(NWELL) of the back gate NWELL can be made to have the relation of: Vy−|vtp(LP7)|≦V(NWELL)<Vy. The gate node of the PMOS transistor P1 is at the same potential as the potential V(NWELL) because the PMOS transistors P8 and TP1 are on. The gate-source voltage vgs(p1) of the PMOS transistor P1 therefore becomes equal to Vtp(LP7). As a result, the PMOS transistor P1 operates in its sub-threshold region at all times, and the current flowing through the PMOS transistor P1 is greatly reduced.

The PMOS transistors LP3 and LP7 can be formed to have the same threshold voltage. As shown in FIG. 9, the PMOS transistor P7 is connected at one end to the drain of the PMOS transistor P4. Instead, the PMOS transistor P7 can have its one end connected to the back gate NWELL.

FIG. 10 shows an output circuit according to a sixth embodiment of the present invention, and FIG. 11 an output circuit according to a seventh embodiment of the invention.

In the output circuit of FIG. 9, the PMOS transistor LP3 is used to set the gate-node potential of the PMOS transistor P1. The PMOS transistor P1 can be located at any point in the path extending between the gate and back gate of the PMOS transistor LP3. Thus, in the output circuit shown in FIG. 10 (i.e., the sixth embodiment), the drain, gate and back gate of the PMOS transistor LP3 are connected to the drain of the PMOS transistor P4. On the other hand, in the output circuit shown in FIG. 11 (i.e., the seventh embodiment), the drain and back gate of the PMOS transistor LP3 are connected directly to the back gate of the PMOS transistor P4, and the gate of the PMOS transistor LP3 is connected to the gate of the PMOS transistor P1.

Figure 8:
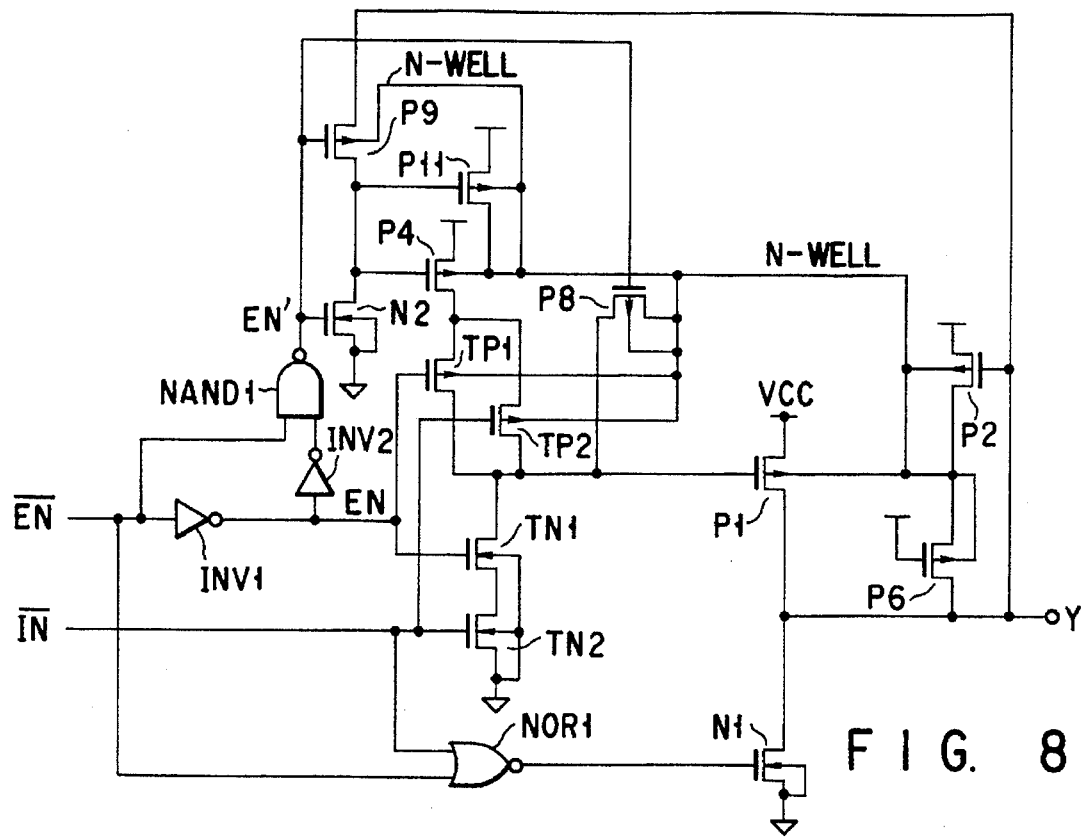
FIG. 8 is a circuit diagram showing an output circuit according to a fourth embodiment of the invention.

PMOS transistors identical to the PMOS transistors LP3 and LP7, both used in the sixth and seventh embodiments (FIG. 10 and 11), may be incorporated in the output circuits of FIGS. 7 and 8, which are the third and fourth embodiments of the invention.

When the potential Vy at the output terminal Y is higher or lower than VCC, the current flowing through the PMOS transistor P1 must be minimized. That is, it is necessary to narrow the range within which the potential Vy causes the phenomenon described above. In other words, a current may flow through the PMOS transistor P1 when VCC−|Ttp(P2)|<Vy<VCC or when VCC<Vy<VCC+|Vtp(P6)|. In order to narrow the range for Vy, the threshold voltages Vtp of the PMOS transistors P2 and P6 need only to be increased so that Vtp(P1)<Vtp(P2) and Vtp(P1)<Vtp(P6), which relationship is similar to that the PMOS transistors LP3 and LP7 have with the PMOS transistor P1.

FIG. 12 shows an output circuit according to an eighth embodiment of the present invention.

As illustrated in FIG. 12, the output circuit has two PMOS transistors LP12 and P12 in place of the PMOS transistor LP7 incorporated in the output circuit of FIG. 9 (i.e., the fifth embodiment). The PMOS transistor LP12 has its source connected to an output terminal Y and its gate and drain connected to the source of the PMOS transistor P12. The PMOS transistor P12 has its drain connected to the gate of the PMOS transistor P1 and its gate connected to receive the above-mentioned signal EN.

While the circuit is disabled because the enable signal /EN is at the H level, the PMOS transistor P12 remains on, whereby the potential of the output terminal Y is applied to the gate of a PMOS transistor P1 through the PMOS transistor LP12. The PMOS transistors LP12 and P12 may be exchange each other's position. In this case, too, the output circuit achieves the same advantage.

FIG. 13 shows an output circuit according to a ninth embodiment of the present invention.

As can be understood from FIG. 13, this circuit differs from the output circuit of FIG. 9 (i.e., the fifth embodiment) in that an additional PMOS transistor P5 is provided. The PMOS transistor P5 has its source-drain path connected between an output terminal Y and the gate of the PMOS transistor P1. The gate of the PMOS transistor P5 is connected to the power-supply potential node.

While the output circuit is disabled because the enable signal /EN is at the H level, the back gate NWELL is pulled up to the potential Vy of the output terminal Y if the potential Vy is higher than the power-supply potential VCC. The PMOS transistor P5 operates in substantially the same way as the PMOS transistor P6, as far as DC current is concerned. The PMOS transistor P6 operates somewhat differently when the potential Vy changes. More specifically, when the potential Vy increases above the power-supply potential VCC, the PMOS transistor P6 can has its back-gate potential quickly follow the potential Vy since its back gate of the transistor P6 is connected directly to the back gate of the PMOS transistor P1. This helps to reduce the base current and emitter-collector current of the PNP bipolar transistor which is a parasitic one formed in the PMOS transistor P1, and also to decrease the current flowing into the P-type substrate. Latch-up is therefor effectively prevented. The back-gate potential is applied to the gate of the PMOS transistor P1 through the PMOS transistor P8. The back-gate potential cannot follow the potential Vy sufficiently fast, due to its resistance component. In the circuit of FIG. 13, the PMOS transistor P5 is connected directly to the gate of the PMOS transistor P1, whereby the back-gate potential follows the potential Vy faster than is possible by using the PMOS transistor P6 only.

FIG. 14 shows an output circuit according to a tenth embodiment of the present invention. This circuit is characterized in that the PMOS transistor P5 is connected to the drain of the PMOS transistor P4, causing the back-gate potential to follow the potential Vy faster than is possible by using only one PMOS transistor, i.e., the PMOS transistor P6.

In the output circuit of FIG. 13 (i.e., the ninth embodiment), since the PMOS transistor P5 is connected to the gate of the PMOS transistor P1, the P-type diffusion layer for either the source or drain of the PMOS transistor P5 makes a parasitic capacitance of the gate node of the PMOS transistor P1. This inevitably lengthens the time for charging the gate node of the PMOS transistor P1 which must fully swing, ultimately decreasing the switching speed of the PMOS transistor P1. By contrast, the PMOS transistor P5 is connected to the drain of the PMOS transistor P4 in the output circuit illustrated in FIG. 14. The gate node of the PMOS transistor P1 therefore does not fully swing, not reducing the switching speed of the PMOS transistor P1.

In both the ninth and tenth embodiments (FIGS. 13 and 14), the PMOS transistors P5 and P6, which operate in almost the same way as far as DC current is concerned, are incorporated for the purpose of making the back-gate potential to follow the potential Vy faster than in the case where only the PMOS transistor P6 is used.

Figure 15:
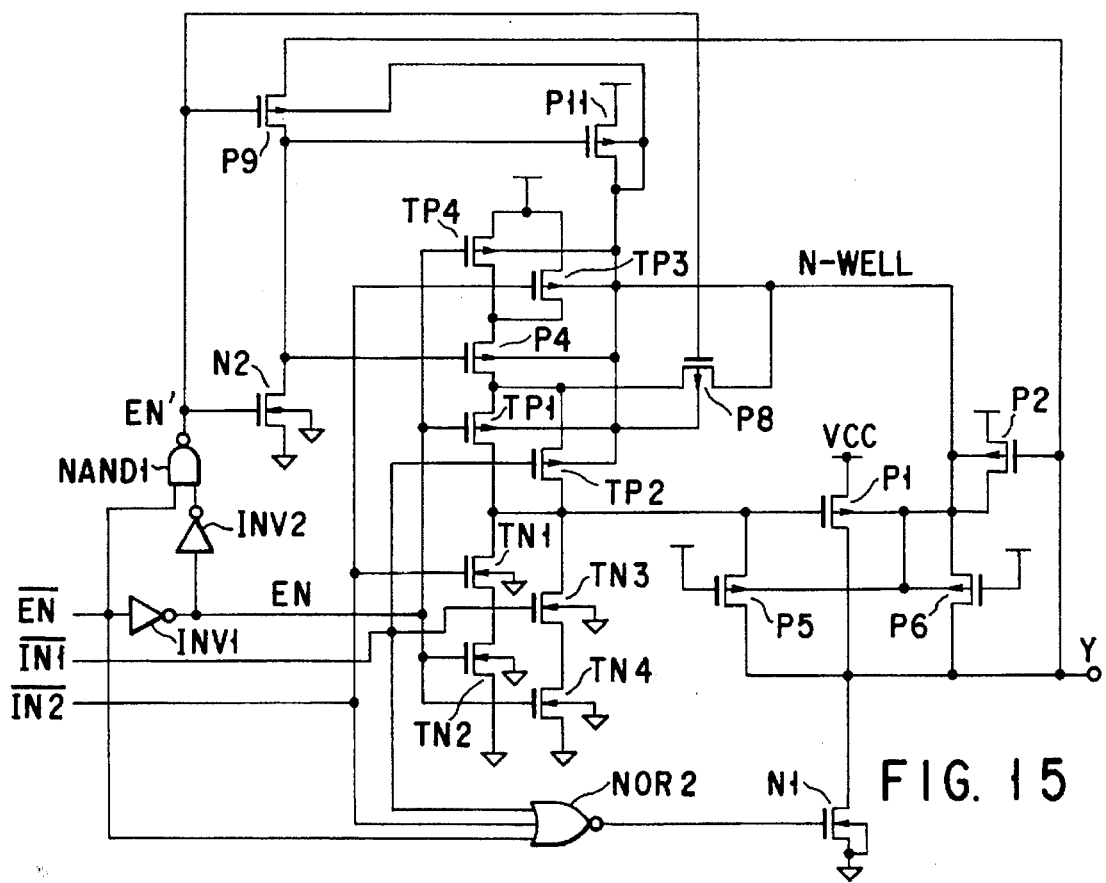
FIG. 15 is a circuit diagram showing an output circuit according to an eleventh embodiment of this invention.

FIG. 15 shows an output circuit according to an eleventh embodiment of this invention. This output circuit differs from the output circuit of FIG. 8 (i.e., the fourth embodiment) in that two input signals/IN1 and/IN2 are supplied to it, whereas a NAND-logic or NOR-logic product of the enable signal /EN and the input signal EN controls the PMOS transistors P1 and P2 of the output section.

In the eleventh embodiment, the source of the PMOS transistor P4 is not directly connected to the power-supply potential node. Between the source of this transistor P4 and the power-supply potential node there are connected the source-drain paths of two NMOS transistors TP3 and TP4. The gate of the NMOS transistor TP4 receives a signal EN which is the output of the inverter INV1. The gate of the NMOS transistor TP3 receives the input signal /IN2. The gate of the PMOS transistor P2 receives the input signal /IN1. The NMOS transistors TN1 and TN2 constitute a series circuit, which is connected in parallel to a series circuit comprised of two NMOS transistors TN3 and TN4 which have their source-drain paths connected in series. The signals/IN2 and EN are supplied to the gates of the NMOS transistors TN1 and TN2, respectively. The signals /IN1 and EN are supplied to the NMOS transistors TN3 and TN4, respectively. A three-input NOR gate NOR2 is used in place of the two-input NOR gate NOR1 incorporated in the circuits of FIGS. 6 to 14 for driving the gate of the NMOS transistor N1. The NOR gate NOR2 receives the signals /EN, /IN1 and /IN2.

Like the output circuits shown in FIGS. 13 and 14, the output circuit of FIG. 15 has a PMOS transistor P5. The circuit differs from the circuit of FIG. 8 only in that two signals, not one, are input to it. It operates basically in he same way. The first to the tenth embodiments (FIG. 4 and FIGS. 6 to 14) may be modified to have a structure similar to the eleventh embodiment illustrated in FIG. 15. The three-input NOR gate NOR2 may be replaced by a NOR gate which has four or more input terminals. Further, the NMOS transistors TN1 and TN2 or the NMOS transistors TN3 and TN4 may be exchange each other's position. Moreover, the series-connection node of the NMOS transistors TN1 and TN2 may be connected to the series-connection node of the NMOS transistors TN3 and TN4.

FIG. 16 illustrates an output circuit according to a twelfth embodiment of the present invention. The components of this circuit, which are similar or identical to those of any embodiment described above, are designated at the same reference numerals in FIG. 16 and will not be described in detail.

In the output circuit of FIG. 16, a PMOS transistor P8 has its source-drain path connected between the gate and back gate of a PMOS transistor P1. The output of an NAND gate NAND2 comprised of PMOS transistor TP1 and TP2 and NMOS transistors TN1 and TN2 is not directly connected to the gate of the PMOS transistor P1, but connected thereto by a switching circuit which comprises an NMOS transistor N3 and PMOS transistors P15 and P16. The source-drain paths of the MOS transistors forming the switching circuit are connected in parallel between the output node of the NAND gate NAND2 and the gate node of the PMOS transistor P1. The output signal EN' of a NAND gate NAND1 is supplied to the gate of the NMOS transistor N3. The potential at the drain node of a PMOS transistor P9 and an NMOS transistor N2 is applied to the gate of a PMOS transistor P15. The potential of the output terminal Y is applied to the gate of the PMOS transistor P16.

In the switching circuit, the PMOS transistor N3 incorporated in the switching circuit is turned on or off, depending on the level of an enable signal /EN, and the PMOS transistors—as can be understood from FIG. 16. On the other hand, the PMOS transistors P15 and P16 are turned on or off by the enable signal /EN and the potential of the output terminal Y.

Various output circuits will be described with reference to FIGS. 17 to 37. With reference to these circuits, it will be explained how to apply a potential higher than the power-supply potential to the output terminal when the circuits are disabled. It should be noted that of some of these circuits are identical to some of the first to twelfth embodiments, while the remaining circuits are modifications, each a combination of two or more of the first to twelfth embodiments.

The output circuit shown in FIG. 17 is identical in structure to the first embodiment (FIG. 4), though illustrated differently. The components similar to or identical to those shown in FIG. 4 are designated at the same reference numerals.

As shown in FIG. 17, this output circuit comprises a control circuit 21 and a pre-driver circuit 22. The control circuit 21 corresponds to a combination of the inverter INV1, the PMOS transistor P9 and the NMOS transistor N2, all shown in FIG. 4. The pre-driver circuit 22 corresponds to a combination of the PMOS transistors TP1 and TP2, both illustrated in FIG. 4.

The output circuit further comprises an NMOS transistor TN1. As shown in FIG. 17, the source of the NMOS transistor TN1 looks as if connected directly to the ground potential node. In fact, it is connected to the node by an NMOS transistor TN2 (not shown). It is through the NMOS transistor TN2 that the ground potential is applied to the source node of the NMOS transistor TN1.

Figure 18:
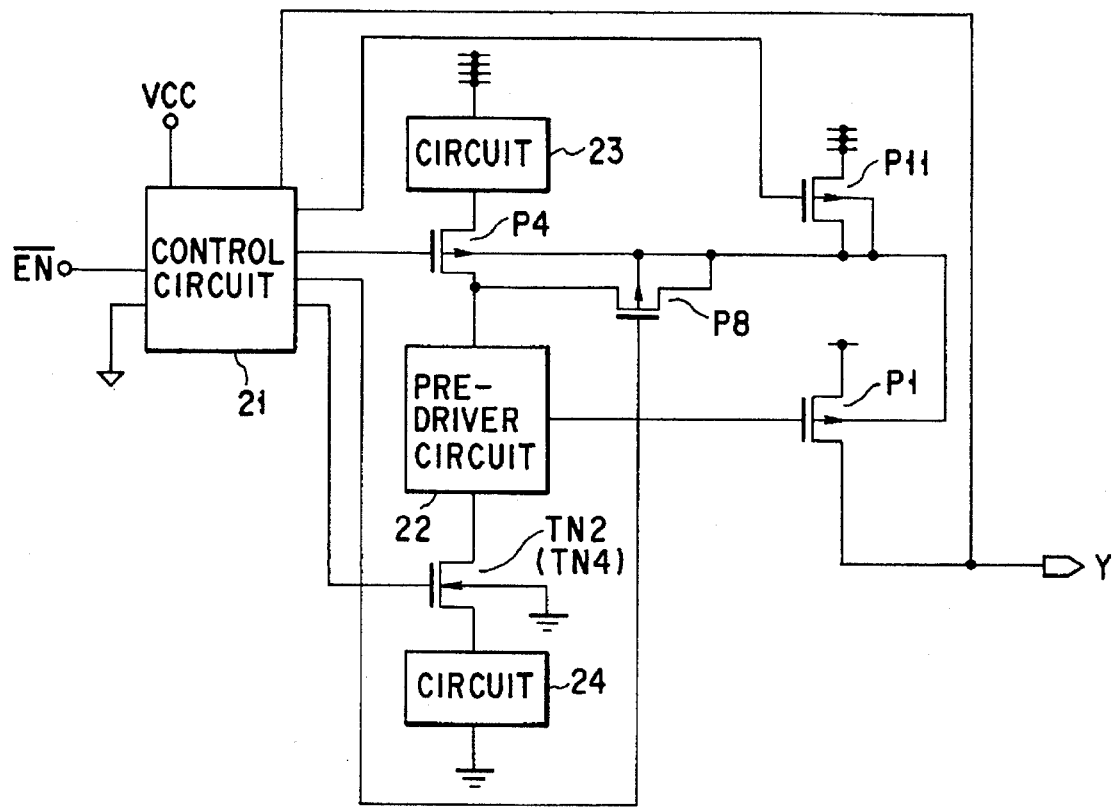
FIG. 18 is a diagram illustrating an identical in structure of the eleventh embodiment shown in FIG. 15.

The output circuit shown in FIG. 18 is identical in structure of the eleventh embodiment (FIG. 15). The components similar to or identical to those shown in FIG. 15 are designated at the same reference numerals.

As shown in FIG. 18, this circuit comprises a control circuit 21, a pre-driver circuit 22 and two circuits 23 and 24. The circuit 21 corresponds to a combination of the inverters INV1 and INV2, the NAND gate NAND1 and the MOS transistors P9 and N2, all shown in FIG. 15. the pre-driver circuit 22 corresponds to a combination of the PMOS transistors TP1 and TP2 and the NMOS transistors TN1 and TN2, all shown in FIG. 15. The circuit 23 is equivalent to a combination of the PMOS transistors TP3 and TP4, both illustrated in FIG. 15. The circuit 24 is connected between, for example, the ground potential node and an NMOS transistor TN2 or TN4 (not shown in FIG. 15).

Figure 19:
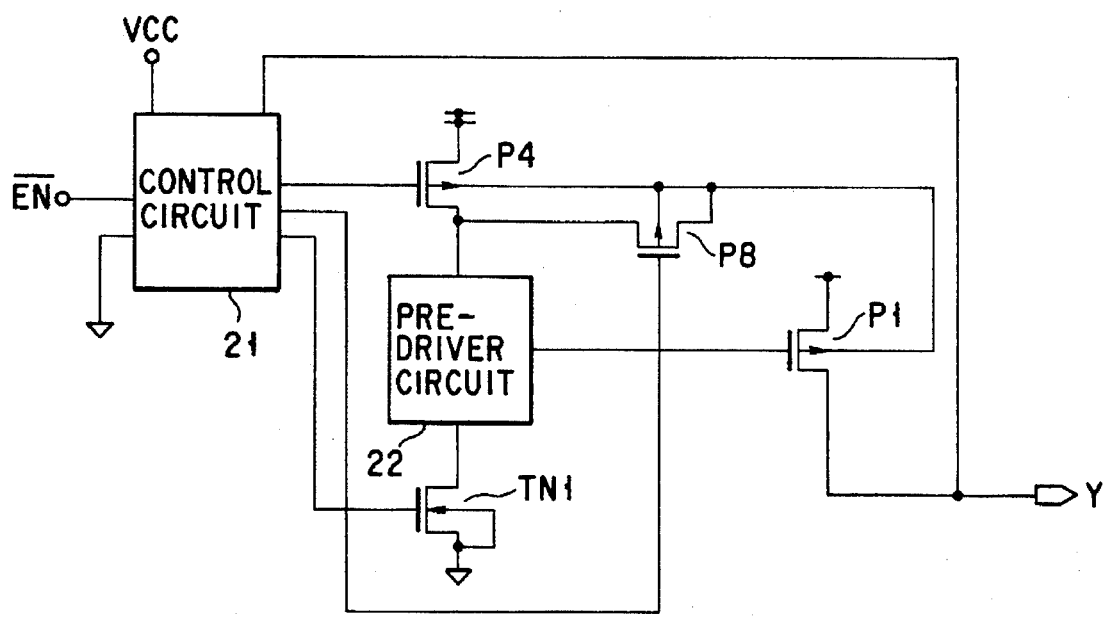
FIG. 19 is a diagram showing a modification of the first embodiment.

The output circuit shown in FIG. 19 is a modification of the first embodiment (FIG. 4). This circuit is identical to the circuit of FIG. 17, except that it has no component equivalent to the PMOS transistor P11. In this circuit, biases are provided by a parasitic pn-unction diode formed between the back gate and the power-supply potential VCC and by a parasitic pn-junction diode formed between the back gate and the output terminal Y.

Figure 20:
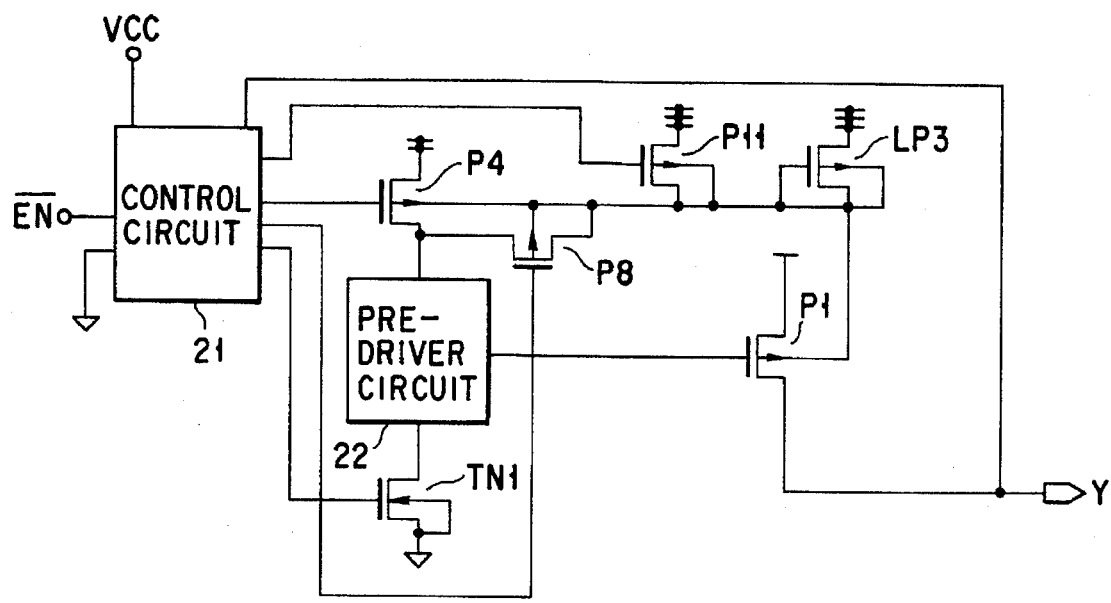
FIG. 20 is a diagram illustrating a modification of the fifth embodiment shown in FIG. 9.

The output circuit shown in FIG. 20 is a modification of the fifth embodiment (FIG. 9). The output circuit is identical to the circuit of FIG. 17, except that it has an additional PMOS transistor LP3.

Figure 21:
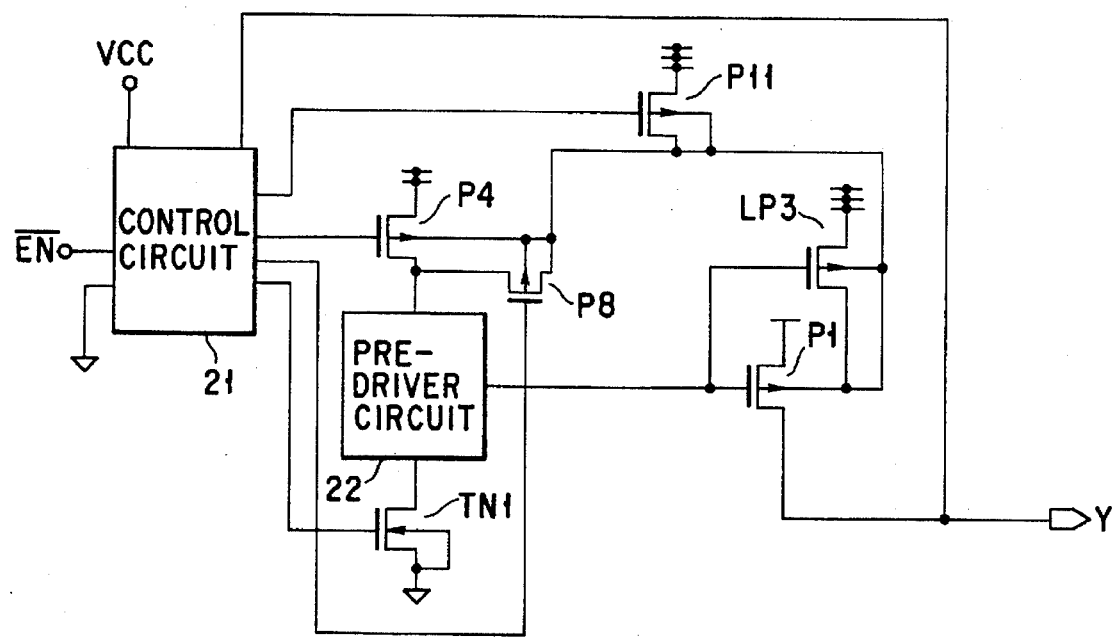
FIG. 21 is a diagram of a modification of the seventh embodiment illustrated in FIG. 11.

The output circuit illustrated in FIG. 21 is a modification of the seventh embodiment (FIG. 11). It differs from the circuit of FIG. 20 in the connection of the gate of the PMOS transistor LP3.

The output circuit of FIG. 22 is a modification of the ninth embodiment (FIG. 13). Like the circuit of FIG. 21, it differs from the circuit of FIG. 20 in the connection of the gate of the PMOS transistor LP3.

The output circuit illustrated in FIG 23 is a modification of the eighth embodiment (FIG. 14). It is identical to the output circuit of FIG. 17, except that it has additional PMOS transistors LP12 and P12. The PMOS transistor P12 may be that one incorporated in the pre-driver circuit 22 as in the ninth embodiment (FIG. 13).

The output circuit shown in FIG. 24 is a further modification of the first embodiment (FIG. 4). It differs from the circuit of FIG. 17 in that it incorporates an additional PMOS transistor P6.

The output circuit shown in FIG. 25 is another modification of the eleventh embodiment (FIG. 15). In this output circuit, two input signals control the output section as in the modified output circuit of FIG. 18. As evident from FIG. 25, the circuit comprises a control circuit 21, a pre-driver circuit 22 and two circuits 23 and 24. The control circuit 21 is a combination of the inverters INV1 and INV2, the NAND gate NAND1, the PMOS transistor P9 and the NMOS transistor N2, all illustrated in FIG. 15. The pre-driver circuit 22 is a combination of the PMOS transistors TP1 and TP2 and the NMOS transistors TN3 and TN4, all shown in FIG. 15. The circuit 23 is a combination of the PMOS transistors TP3 and TP4, both shown in FIG. 15. The circuit 24 is connected between, for example, the ground potential node and an NMOS transistor TN2 or TN4 (not shown in FIG. 15).

The output circuit of FIG. 26 is still another modification of the first embodiment (FIG. 4). It differs from the circuit of FIG. 19 in that it incorporates an additional PMOS transistor P6.

The output circuit shown in FIG. 27 is another modification of the fifth embodiment (FIG. 9). It differs from the circuit of FIG. 24 in that it has additional PMOS transistor LP3.

The output circuit of FIG. 28 is another modification of the seventh embodiment (FIG. 11). It differs from the circuit of FIG. 24 in the connection of the gate of the PMOS transistor LP3.

The output circuit shown in FIG. 29 is another modification of the ninth embodiment (FIG. 13). It differs from the circuit of FIG. 24 in the connection of the gate of the PMOS transistor LP3.

Figure 30:
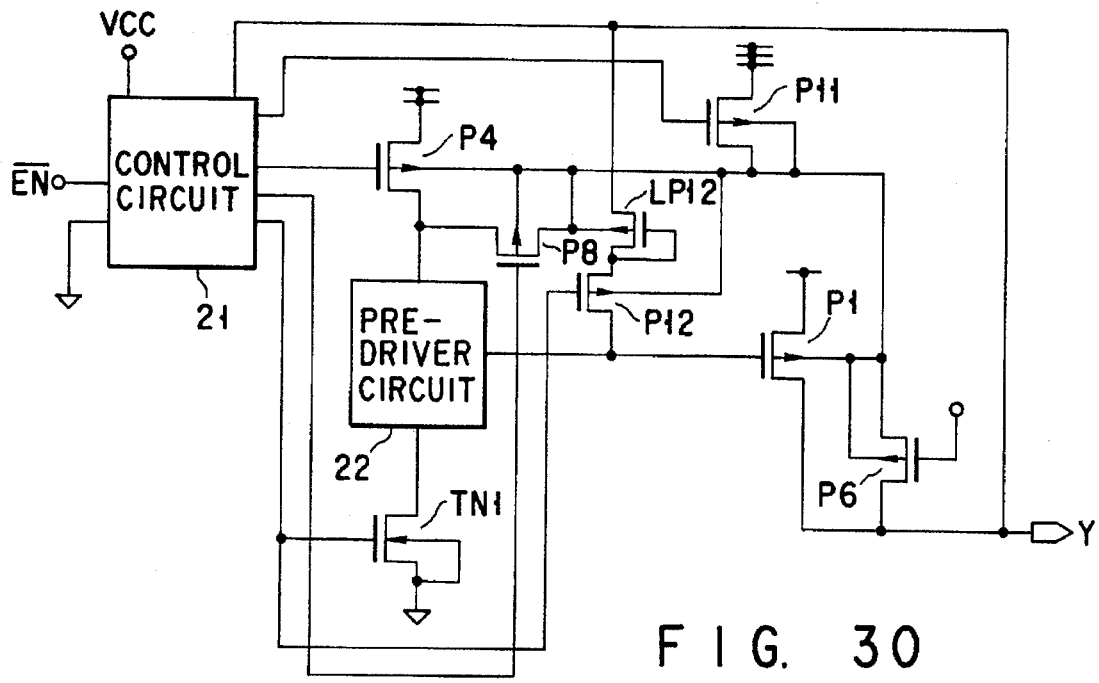
FIG. 30 is a diagram showing still another modification of the eighth embodiment.

The output circuit of FIG. 30 is still another modification of the eighth embodiment (FIG. 12). This circuit is identical to the output circuit of FIG. 28, except that it has additional PMOS transistors LP12 and P12.

Figure 31:
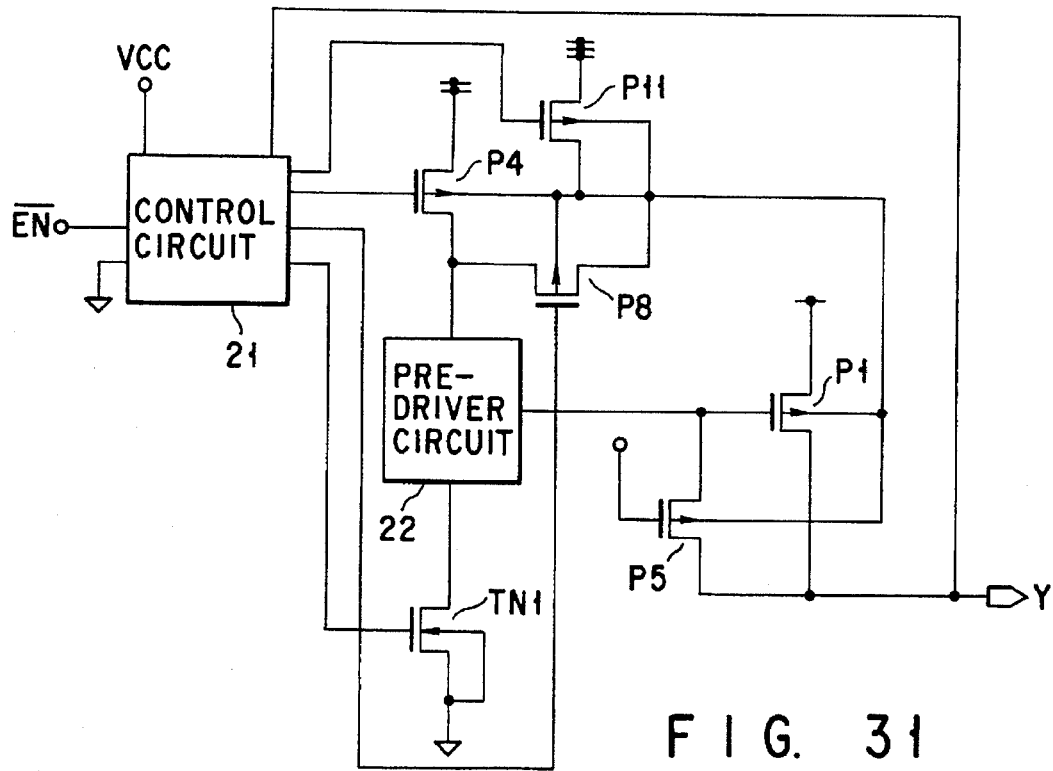
FIG. 31 is a diagram representing another modification of the ninth embodiment.

The output circuit shown in FIG. 31 is another modification of the ninth embodiment (FIG. 13). The output circuit is identical to the circuit of FIG. 17, except that it has an additional PMOS transistor P5. That end of the PMOS transistor P5, which is connected to the gate of, for example, the gate of the PMOS transistor P1, may be connected to the line connecting the gate of the PMOS transistor P1 and the drain of the PMOS transistor P4 as illustrated in FIG. 14. If this is the case, the PMOS transistor P5 can be used as a component of he pre-driver circuit 22.

Figure 32:
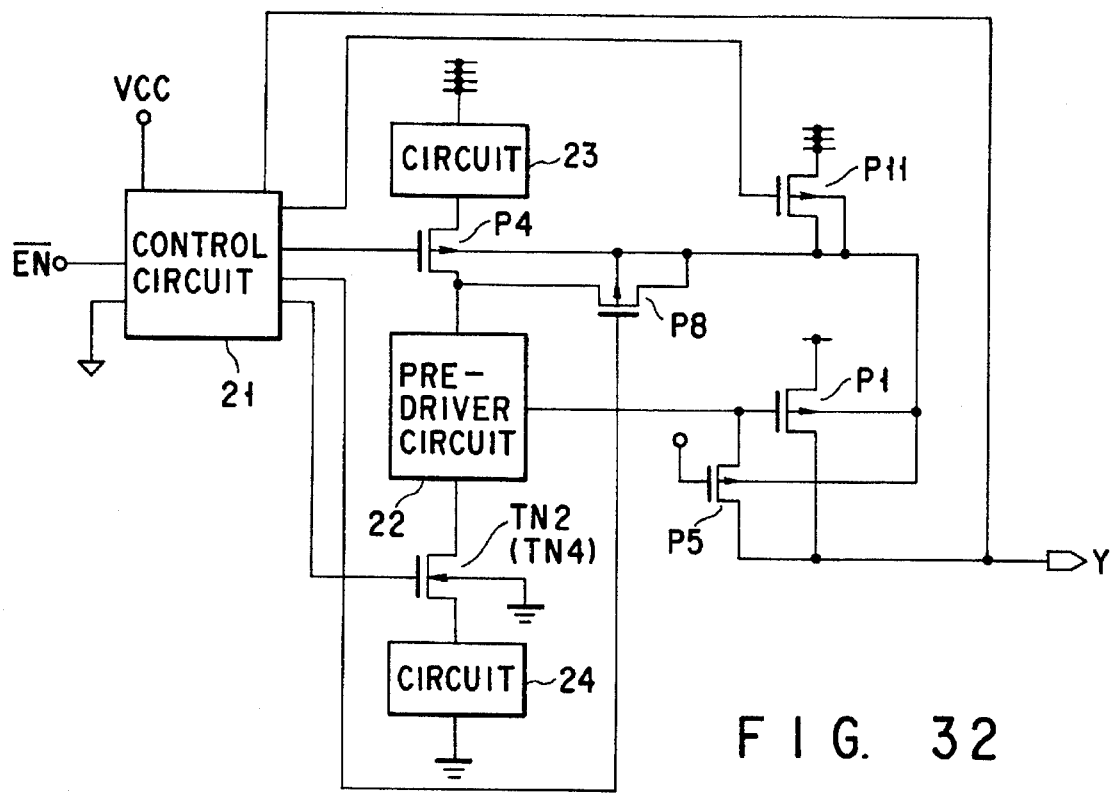
FIG. 32 is a diagram showing another modification of the eleventh embodiment.

The output circuit Shown in FIG. 32 is another modification of the eleventh embodiment (FIG. 15). It is of the same structure as the output circuit of FIG. 18, but has an additional PMOS transistor P5. Like the circuit of FIG. 18, it receives two input signals, which control the output section. The components identical to those shown in FIG. 18 are designated with the same reference numerals. As in the circuit of FIG. 18, the control circuit 21 is a combination of the inverters INV1 and INV2, the NAND gate NAND1, the PMOS transistor P9 and the NMOS transistor N2; the pre-driver circuit 22 is a combination of the PMOS transistors TP1 and TP2 and NMOS transistors TP3 and TP4; the circuit 23 is a combination of the PMOS transistors TP3 and TN4; and the circuit 24 is provided between the NMOS transistor TN2 or TN4 and the power-supply potential node.

Figure 33:
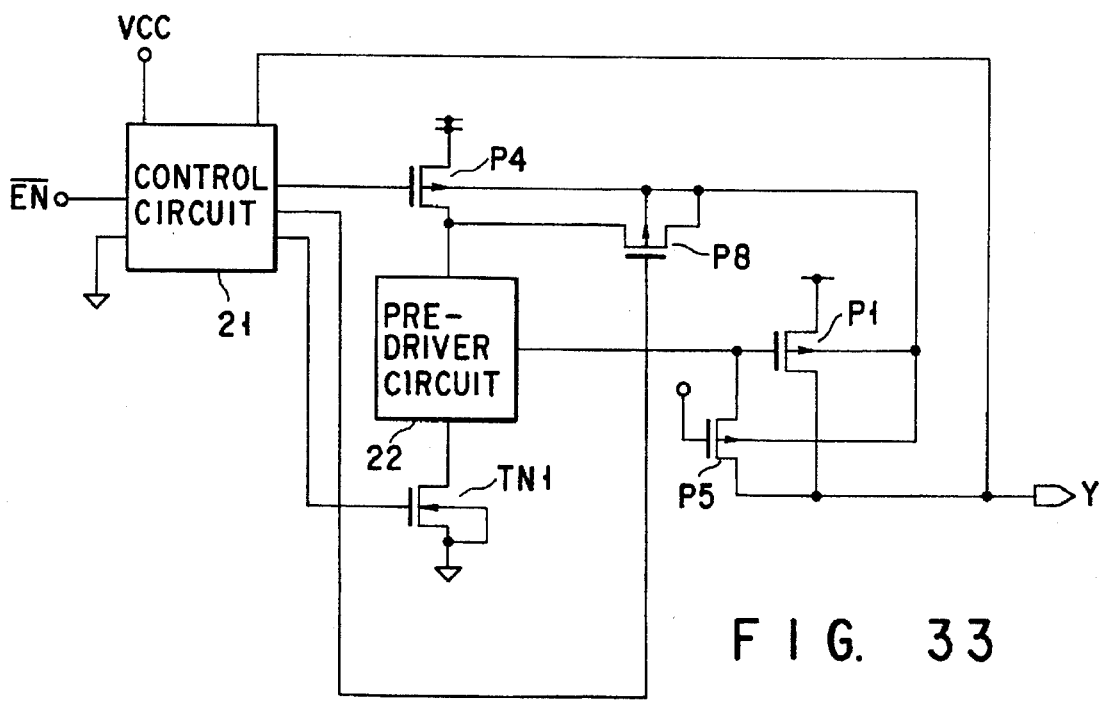
FIG. 33 is a diagram showing another modification of the first embodiment.

The output circuit illustrated in FIG. 33 is another modification of the first embodiment (FIG. 4). The circuit differs from the output circuit of FIG. 19 only in that it has an additional PMOS transistor P5.

Figure 34:
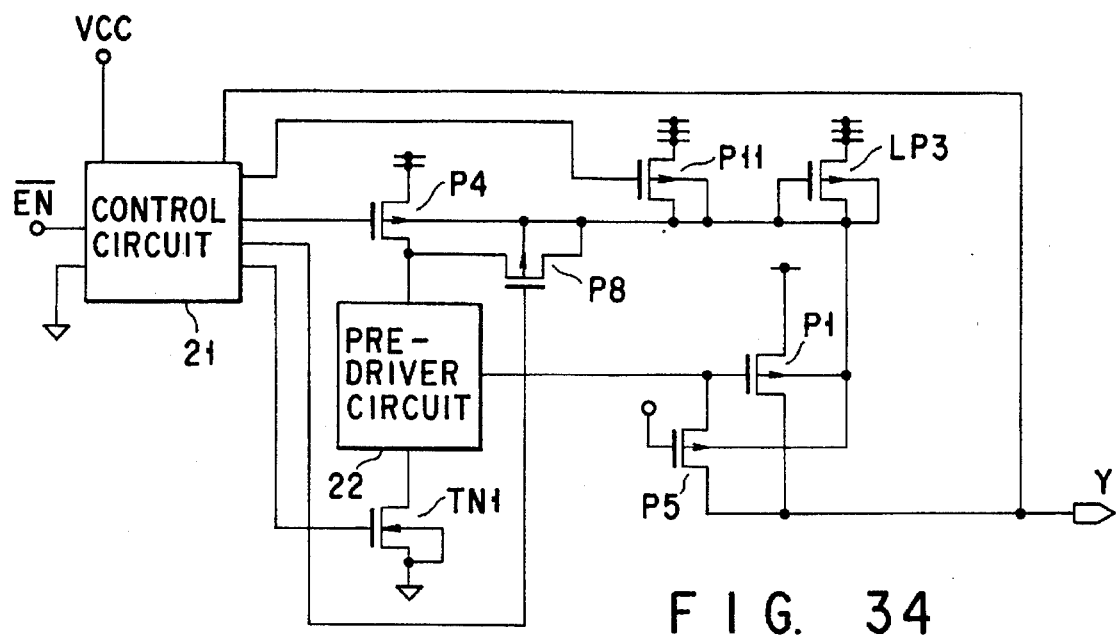
FIG. 34 is a diagram representing a modification of the circuit shown in FIG. 33.

The output circuit of FIG. 34 is a modification of the circuit shown in FIG. 33. It differs from the output circuit of FIG. 33 only in that it has two additional PMOS transistors P11 and LP3.

Figure 35:
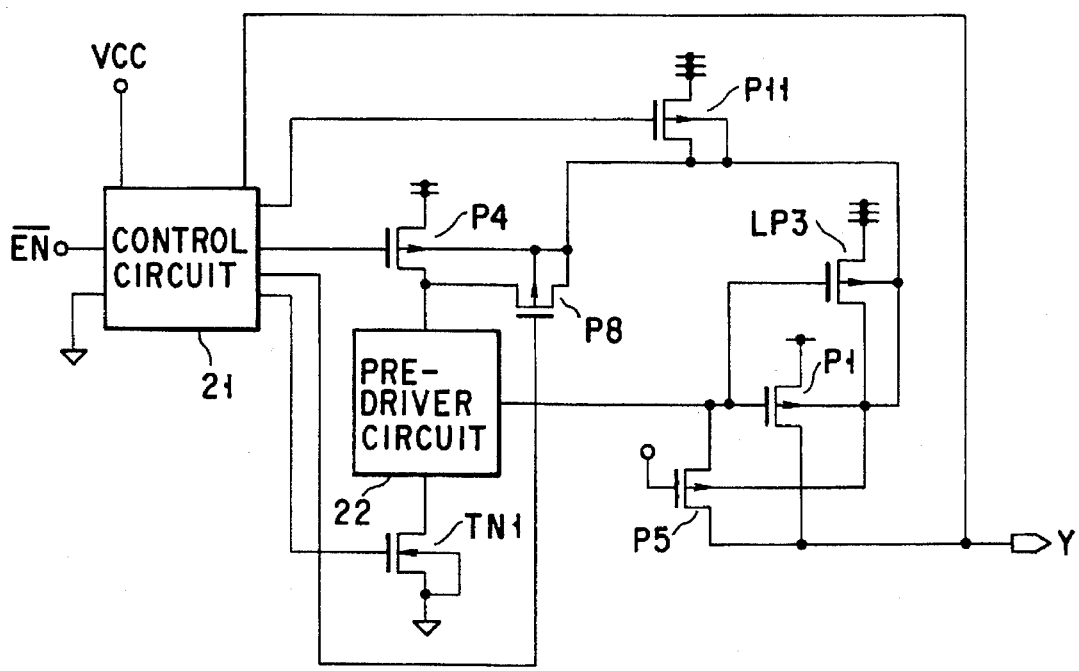
FIG. 35 is a diagram representing a modification of the circuit shown in FIG. 34.

The output circuit shown in FIG. 35 is a modification of the output circuit shown in FIG. 34. In the circuit, the gate of the PMOS transistor LP3 is connected in a different manner.

Figure 36:
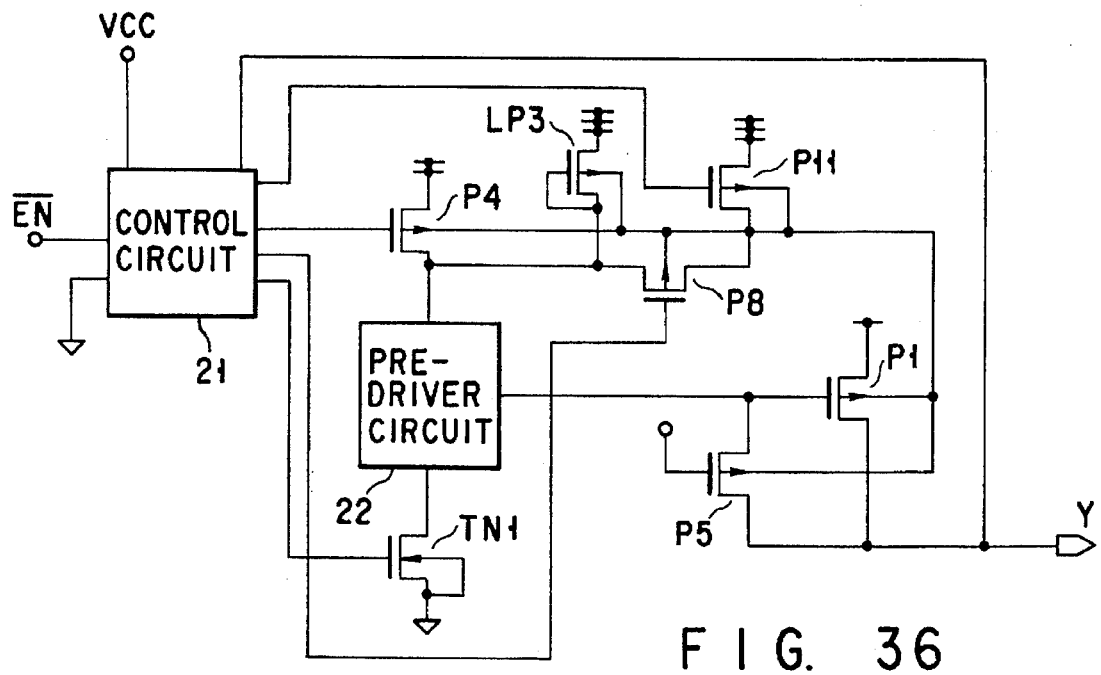
FIG. 36 is a diagram representing a modification of the circuit shown in FIG. 34.

The output circuit of FIG. 36 is a modification of the circuit shown in FIG. 34. It differs only in that the PMOS transistor LP3 is provided at a different position.

Figure 37:
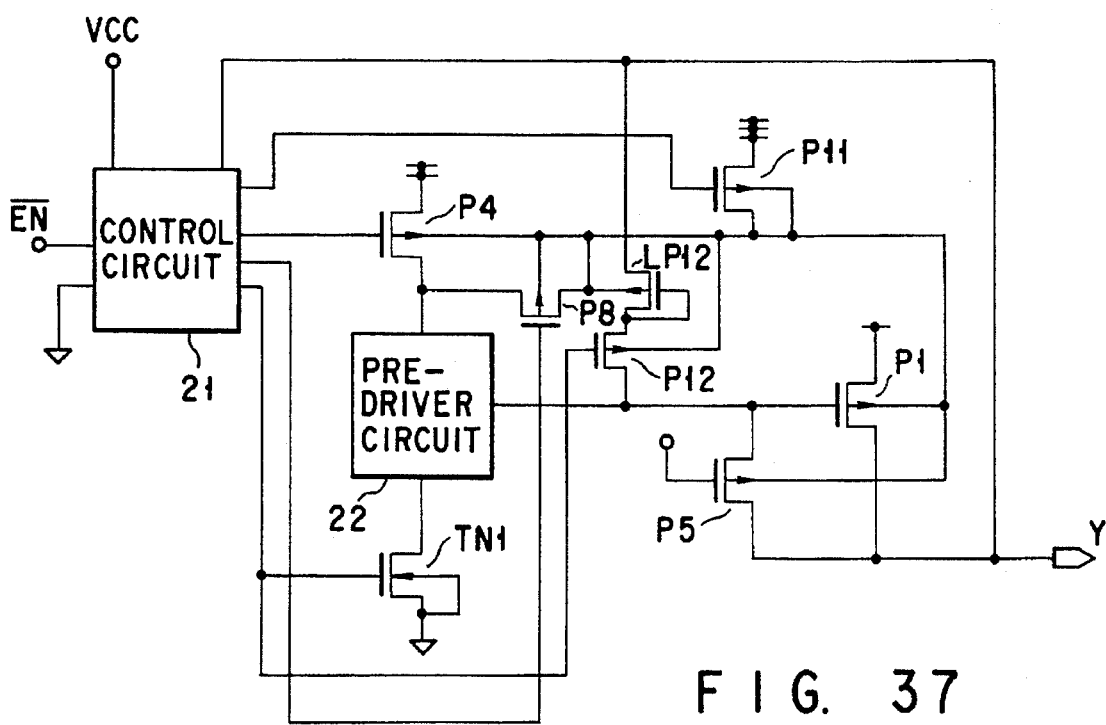
FIG. 37 is a diagram representing a modification of the circuit shown in FIG. 30.

The output circuit shown in FIG. 37 is a modification of the output circuit shown in FIG. 30. It differs in that a PMOS transistor P5 is used in place of the PMOS transistor P6.

Various output circuits will be described with reference to FIGS. 38 to 52. With reference to these circuits, it will be explained how to apply a potential higher than the power-supply potential to the output terminal when the circuits are disabled. It should be noted that of some of these circuits are identical to some of the first to twelfth embodiments, while the remaining circuits are modifications, each a combination of two or more of the first to twelfth embodiments.

The output circuit shown in FIG. 38 is identical in structure to the fourth embodiment (FIG. 8), though illustrated differently. It comprises four switches SW1, SW2, SW3 and SW4 which are respectively the PMOS transistors P4, P8 and P11 and the NMOS transistor TN1. The switch SW3 is connected at one end directly to the power-supply potential node.

The output circuit of FIG. 39 is a modification of the circuit sown in FIG. 38. The circuit is characterized in that the switch SW3 is connected at one end to the source node of the PMOS transistor P1 which is shown in FIG. 8. The PMOS transistor P11 shown in FIG. 8, too, has its source set at the same potential as the source of the PMOS transistor P1, and is therefore not illustrated in FIG. 39.

The output circuit illustrated in FIG. 40 is a modification of the fourth embodiment (FIG. 8). In the circuits of FIGS. 38 and 39, the switches SW1 and SW4 are connected at one end to constant potential nodes. The output circuit of FIG. 40 differs in that the switches SW1 and SW4 are connected at one end to the power-supply potential node and the ground potential node, respectively.

The output circuit shown in FIG. 41 is a combination of the fourth and eleventh embodiments (FIGS. 8 and 15). The circuit has circuits 23 and 24. The circuit 23 is provided between the switch SW1 and the power-supply potential node, and the circuit 24 between the switch SW4 and the ground potential node.

The output circuit of FIG. 42 is a modification of the output circuit shown in FIG. 38. It differs from the circuit of FIG. 38 only in that there is provided no component which corresponds to the switch SW3. The circuit has a PMOS transistor P11 (not shown) which serve to achieve the advantage of the present invention, only if driven by the bias generated by a parasitic pn-junction diode. The PMOS transistor P11 is used to reliably pull up the back gate of the PMOS transistor P1 to the power-supply potential VCC.

Figure 43:
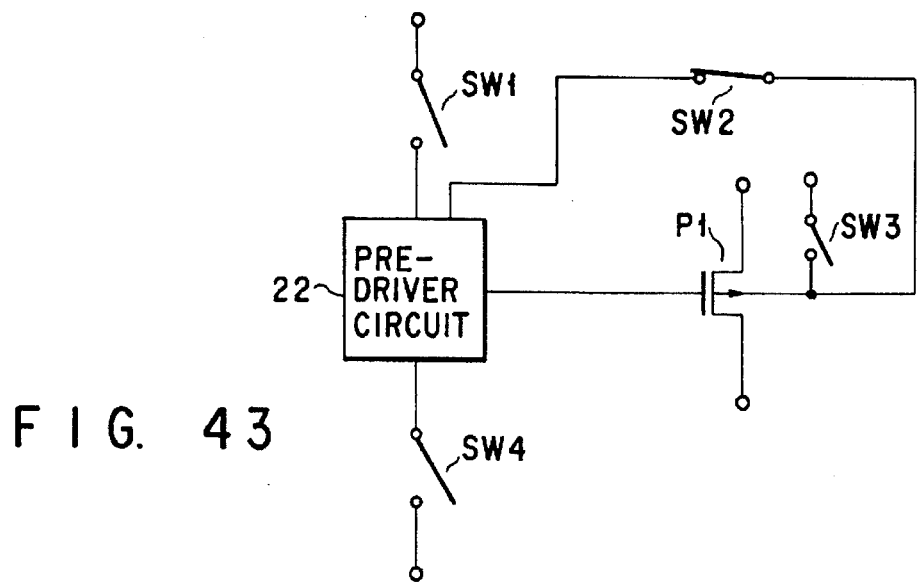
FIG. 43 is a diagram of another modification of the the output circuit shown in FIG. 38.

The output circuit shown in FIG. 43 is another modification of the the output circuit shown in FIG. 38. The circuit of FIG. 43 differs from that of FIG. 38 in that the switch SW2 is connected at one end not directly to the gate of the PMOS transistor P1, but indirectly connected thereto by the pre-driver circuit 22.

Figure 44:
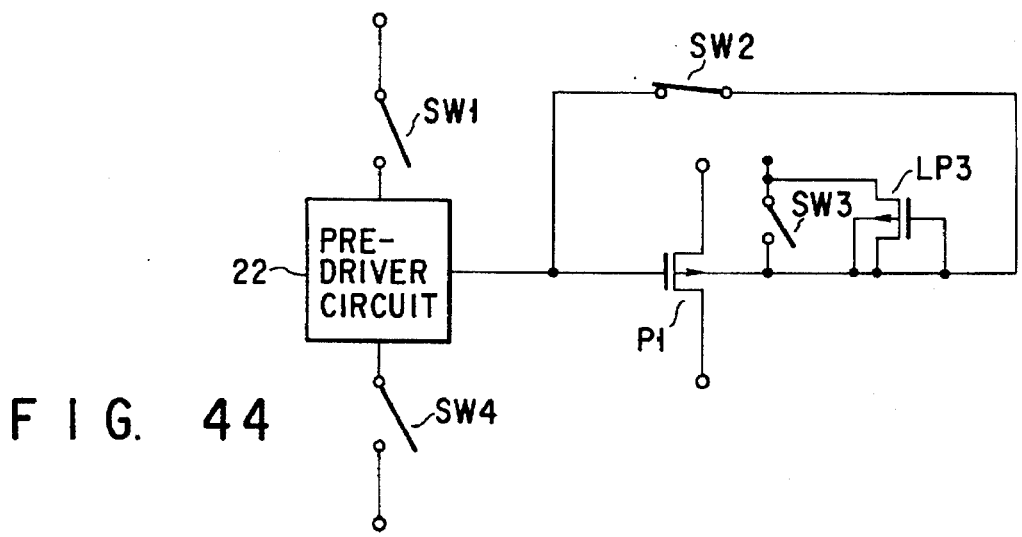
FIG. 44 is a diagram of still another modification of the circuit shown in FIG. 38.

The output circuit of FIG. 44 is still another modification of the circuit shown in FIG. 38. It differs from the circuit of FIG. 38 in that the gate of the PMOS transistor LP3 is connected one end of the switch SW3.

Figure 45:
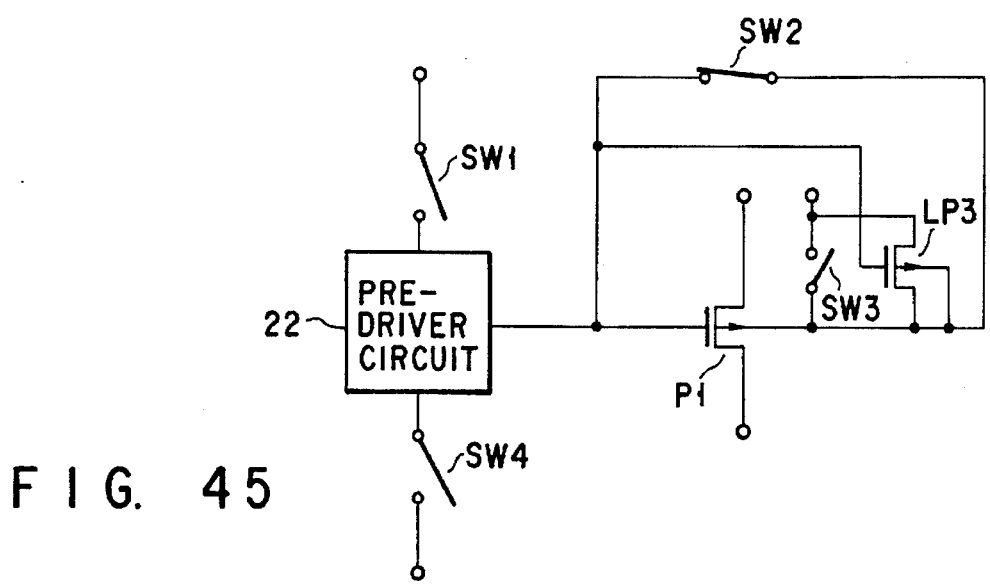
FIG. 45 is a diagram showing a further modification of the the circuit shown in FIG. 38.

The output circuit shown in FIG. 45 is a further modification of the the circuit illustrated in FIG. 38. It differs from the circuit of FIG. 38 in that it has a PMOS transistor LP3, whose gate is connected to the Gate of the PMOS transistor P1.

Figure 46:
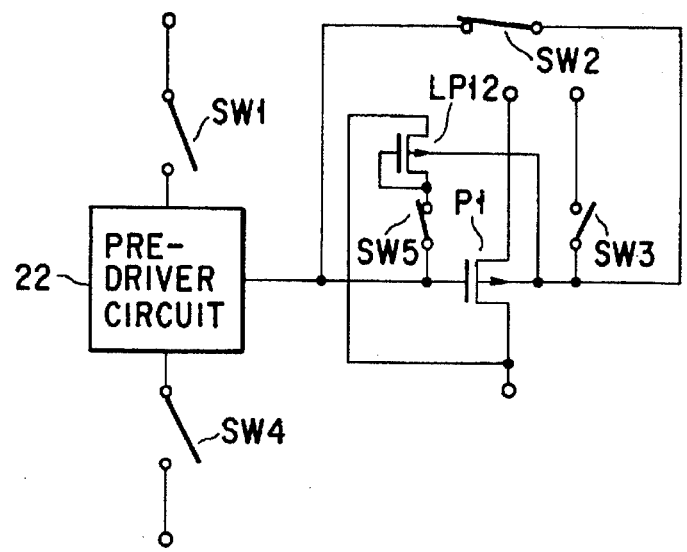
FIG. 46 is a diagram showing another modification of the circuit illustrated in FIG. 38.

The output circuit of FIG. 46 is a modification of the eighth embodiment (FIG. 12). It differs from the circuit of FIG. 38 in that it comprises an additional PMOS transistor LP12 and an additional switch SW5. The switch SW5 is equivalent to the PMOS transistor P12. The switch SW5 may be connected at one end to the back gate of the PMOS transistor P1. Further, the switch SW5 may be used as a component of the pre-driver circuit 22.

FIGS. 47 to 52 illustrate output circuits according to the invention, in which a switch SW6 is provided between the pre-driver circuit 22 and the gate of the PMOS transistor P1.

Figure 47:
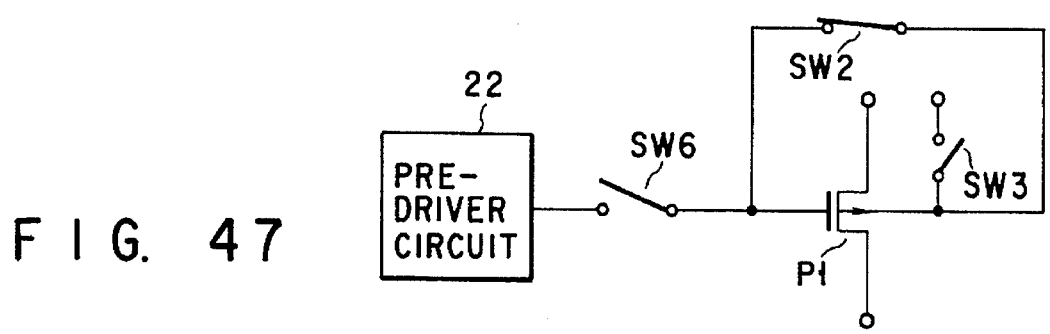
FIG. 47 is a diagram illustrating an output circuit according to the invention.

In the output circuit of FIG. 47, the switches SW2 and SW3 are the PMOS transistors P8 and P11, respectively. The

17 switch SW3 has its one end directly connected to the power-supply potential node.

Figure 48:
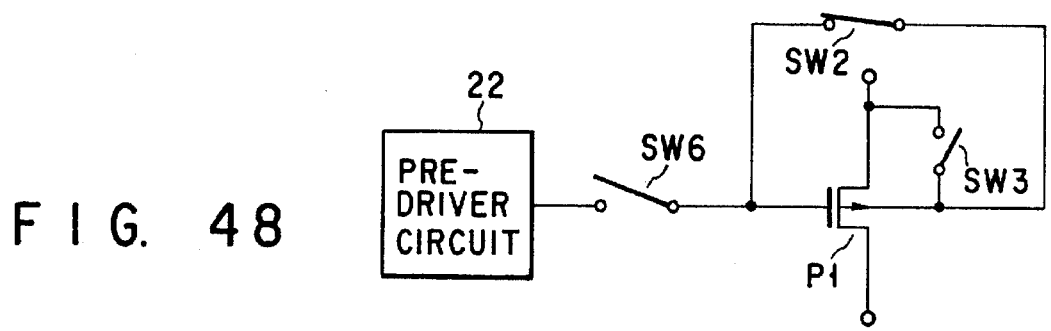
FIG. 48 is a diagram showing a modification of the output circuit shown in FIG. 47.

The output circuit shown in FIG. 48 is a modification of the output circuit shown in FIG. 47. It is characterized in that the switch SW3 has its one end connected to the source node of the PMOS transistor P1.

Figure 49:
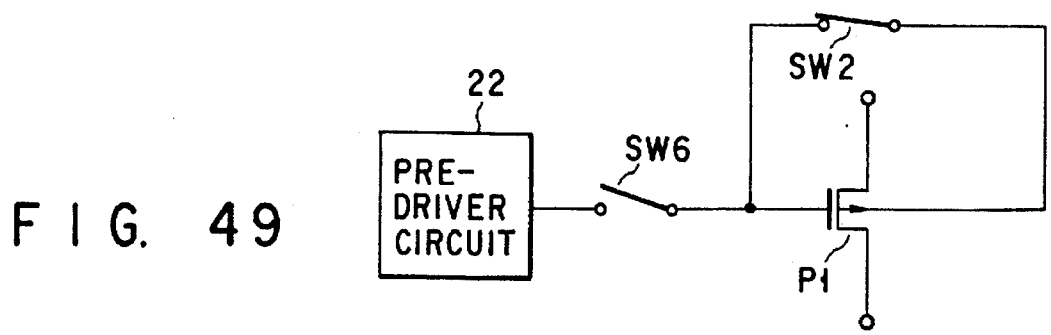
FIG. 49 is a diagram showing another modification of the output circuit shown in FIG. 47.

The output circuit of FIG. 49 is another modification of the circuit shown in FIG. 47. It has no component equivalent to the switch SW3 incorporated in the circuit of FIG. 47.

The output circuit of FIG. 50 is a another modification of the circuit shown in FIG. 47. It is characterized in that an additional PMOS transistor LP3 is provided. The gate of the PMOS transistor LP3 is connected to the back gate of the PMOS transistor P1.

The output circuit illustrated in FIG. 51 is a modification of the output circuit shown in FIG. 50. It differs from the circuit of FIG. 50 in that the gate of the PMOS transistor LP3 is Connected to that of the PMOS transistor P1.

The output circuit of FIG. 52 is a modification of the output circuit shown in FIG. 49. The circuit of FIG. 52 is characterized in that it has additional PMOS transistors LP12 and P12.

In the output circuits illustrated in FIGS. 38 to 52, the PMOS transistor P1 may be replaced by an N-channel MOS transistor.

Figure 53:
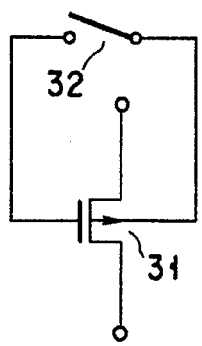
FIG. 53 is a circuit diagram showing a major part of the output circuits according to the invention.

FIG. 53 is a circuit diagram showing a major part of the output circuits according to the invention. As shown in FIG. 53, the back gate and source of the PMOS transistor 31 are not connected to each other. Rather, they are isolated in terms of potential. The back gate and gate of the transistor 31 are connected together by a switch 32. Thus, they remain at the same potential as long as the switch 32 is closed. The back gate of the PMOS transistor 31 is set at a potential of (Vs−Vf), where Vs is the source potential and Vf is the built-in potential of the parasitic pn-junction diode provided between the back gate and the source. The gate of the PMOS transistor 31 is set at this potential, too, while the switch 32 remains closed. If the PMOS transistor 31 has a threshold voltage Vtp(31) which is lower than −Vf, that is, −Vf>Vtp (B1), it will be turned off. In this case, no current will flow through the source-drain path of the PMOS transistor 31.

Figure 54:
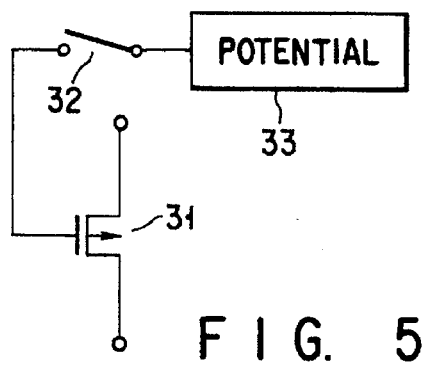
FIG. 54 is a diagram illustrating a circuit of a type different from the circuit shown in FIG. 53.

In the circuit of FIG. 53, the switch 32 is closed, enabling the PMOS transistor 31 to generate a potential, which is used to turn off the PMOS transistor 31. Instead, the potential of (Vs−Vf) may be generated outside the PMOS transistor 31 and may be applied to the back Gate of the PMOS transistor 31 through the switch 32. FIG. 54 shows a circuit which embodies this technical idea.

As shown in FIG. 54, the back gate and source of the PMOS transistor 31 are isolated in terms of potential, as in the circuit of FIG. 53. A potential-generating circuit 33 is provided. The circuit 33 generates a potential which is equivalent to the potential (Vs−Vf) generated at the back gate of the PMOS transistor 31. The potential is applied to the gate of the PMOS transistor 31 through the switch 32.

Figure 55:
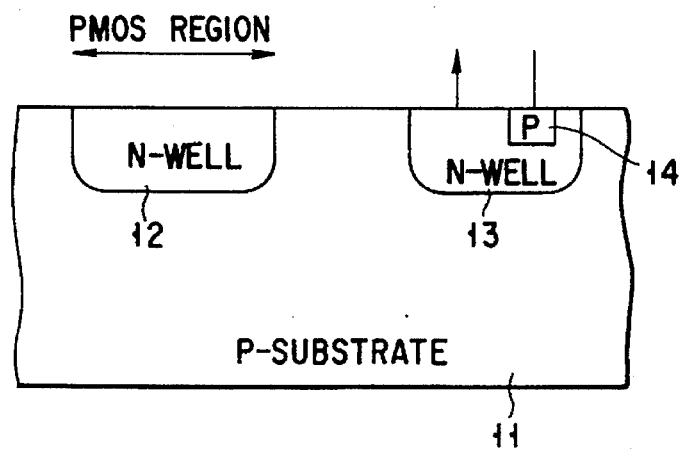
FIG. 55 is a sectional view illustrating the potential-generating circuit incorporated in the circuit of FIG. 54 is formed.
Figure 56:
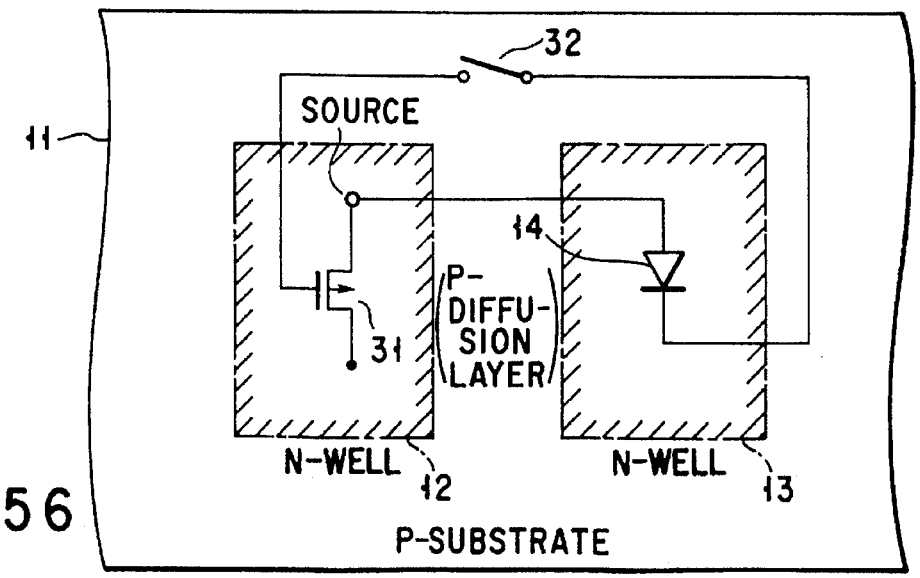
FIG. 56 is a circuit diagram of the potential-generating circuit shown in FIG. 55.

AS shown in FIG. 55, the circuit 33 comprises a pn-junction diode made of an N-type well (N-WELL) 13 and a p-type diffusion layer 14. The N-type well 13 is formed in a P-type substrate 11 and spaced apart from the N-type well (N-WELL) 12 formed in the substrate 11. As shown in FIG. 56, the N-type well 13 and the P-type diffusion layer 14 constitute a pn-unction diode, and a potential, which is lower than the source potential of the transistor 31 by the above-mentioned built-in potential, is applied to the gate of the PMOS transistor 31 through the switch 32.

18

The pn-junction diode may be formed by using a P-type diffusion layer which serves as the source or drain of a PMOS transistor other than the PMOS transistor As has been described, the present invention can provide an output circuit which can produce an output signal capable of fully swinging and which prevents a current from flowing between its power-supply potential source and the power-supply potential source of any other output circuit receiving a power-supply potential of a different value.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output circuit comprising:
   a first MOS transistor having a source, a drain, a gate and a back gate isolated from both said source and said drain in terms of potential;
   a first switch coupled between said back gate and said gate of said first MOS transistor, said first switch being ON/OFF controlled by a control signal;
   a potential-applying circuit for applying a potential to said gate of said first MOS transistor;
   a second switch coupled between an output node of said potential-applying circuit and said gate of said first MOS transistor;
   a first node supplied with a first reference, potential;
   a third switch coupled between said back gate of said first MOS transistor and said first node; and
   a second MOS transistor of the same conductivity type as said first MOS transistor, said second MOS transistor having a source coupled to one end of said third switch and a drain and a gate both coupled to said back gate of said first MOS transistor,
   wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to orate said first MOS transistor in a sub-threshold region.

2. The output circuit according to claim 1, wherein said first and second switches are controlled such that said potential-applying means changes a potential difference between said source and said gate of said first MOS transistor to substantially zero and then drives said first MOS transistor in the sub-threshold region.

3. An output circuit comprising:
   a first MOS transistor having a source, a drain, a gate and a back gate isolated from both said source and said drain in terms of potential;
   a first switch coupled between said back gate and said gate of said first MOS transistor, said first switch being ON/OFF controlled by a control signal;
   a potential-applying circuit for applying a potential to said gate of said first MOS transistor;
   a second switch coupled between an output node of said potential-applying circuit and said gate of said first MOS transistor;

a first node supplied with a first reference potential;

a third switch coupled between said back gate of said first MOS transistor and said first node; and a second MOS transistor of the same conductivity type as said first MOS transistor, said second MOS transistor having a source coupled to one end of said third switch, a drain coupled to said back gate of said first MOS transistor and a gate coupled to said gate of said first MOS transistor, wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to operate said first MOS transistor in a sub-threshold region.

4. The output circuit according to claim 3, wherein said second MOS transistor has a threshold voltage which is equal to or less than that of said first MOS transistor in terms of absolute value.

5. An output circuit comprising:

a first MOS transistor having a source, a drain, a gate and a back gate isolated from both said source and said drain in terms of potential;

a second MOS transistor of the same conductivity type as said first MOS transistor, said second MOS transistor having a source coupled to said drain of said first MOS transistor and a drain and a gate which are coupled to each other;

a first switch coupled between said back gate and said gate of said first MOS transistor, said first switch being ON/OFF controlled by a control signal;

a potential-applying circuit for applying a potential to said gate of said first MOS transistor;

a second switch coupled between an output node of said potential-applying circuit and said gate of said first MOS transistor;

a first node supplied with a first reference potential;

a third switch coupled between said back gate of said first MOS transistor and said first node; and a fourth switch coupled between a node of said drain and said gate of said second MOS transistor and said gate of said first MOS transistor, wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to operate said first MOS transistor in a sub-threshold region.

6. The output circuit according to claim 5, wherein said second MOS transistor has a threshold voltage which is equal to or less than that of said first MOS transistor in terms of absolute value.

7. An output comprising:

first and second high-potential nodes supplied with first and second high potentials, respectively;

a first low-potential node supplied with a first low potential;

first and second reference-potential nodes supplied with first and second reference potentials, respectively;

an output terminal;

a first MOS transistor having a source coupled to said first high-potential node, a drain coupled to said output terminal, a gate, and a back gate isolated from said source in terms of potential;

a pre-driver circuit having an output node coupled to said gate of said first MOS transistor, for generating a potential for driving said gate of said first MOS transistor, said pre-driver circuit including a first end coupled to said low-potential node, and a second end;

a first path gate coupled between said second high-potential node and said second end of said pre-driver circuit;

a second path gate having a first end coupled to a node of said first path gate and said pre-driver circuit and a second end coupled to said back gate of said first MOS transistor; and a control circuit supplied with the first and second reference potentials and a potential of said output terminal, for applying the potential of said output terminal or the second reference potential, which is required to render said first path gate conducting, to said first path gate in accordance with a control signal, for applying a potential, which is required to control ON/OFF states of said second path gate, to said second path gate in accordance with the control signal wherein said control circuit applies the potential of said output terminal to said first path gate, a potential, which is required to render said second path gate conducting, to said second path gate when a potential higher than said first high potential is applied to said output terminal, and said control circuit applies a potential, which is required to render said second path gate non-conducting, to said second path gate and said second reference potential to said first path gate when a potential higher than said first high potential is not applied to said output terminal.

8. The output circuit according to claim 7, further comprising a third path gate coupled between said first reference-potential node and said back gate of said first MOS transistor, wherein said control circuit applies said potential of said output terminal to said third path gate when a potential higher than said first high potential is applied to said output terminal, and wherein said control circuit applies a potential, which is required to render said third path gate conducting, to said third path gate when a potential higher than said first high potential is not applied to said output terminal.

9. The output circuit according to claim 8, wherein each of said first, second and third path gates comprises a P-channel MOS transistor having a back gate coupled to said back gate of said first MOS transistor.

10. The output circuit according to claim 9, further comprising an N-channel MOS transistor having a drain coupled to said output terminal and a source coupled to said first low-potential node.

11. The output circuit according to claim 8, wherein said first path gate, said second path gate and said third path gate each comprise a P-channel MOS transistor having a back gate connected to said back gate of said first MOS transistor.

12. The output circuit according to claim 7, further comprising a first circuit coupled between said second high-potential node and said first path gate.

13. The output circuit according to claim 7, wherein the first and second high potentials and the first reference potential is set at a first power-supply potential, the first low potential and the second reference potential are set at a second power-supply potential, and the second power-supply potential is lower than the first power-supply potential.

14. The output circuit according to claim 7, wherein said second path gate has a first end coupled to said back gate of said first MOS transistor and a second end coupled to a midpoint of a path extending from a node of said first path gate and said pre-driver circuit to said gate of said first MOS transistor.

15. The output circuit according to claim 7, wherein, in the case that the potential of said output terminal is applied from said control circuit to said first path gate, said pre-driver circuit changes a potential difference between said source and said gate of said first MOS transistor to substantially zero and thereafter applies the potential of said output terminal, instead of the second reference potential, to said first path gate, and applies said potential, which is required to render said second path gate conducting, to said second path gate.

16. The output circuit according to claim 7, further comprising a second MOS transistor which has a source coupled to said first reference-potential node, and a drain and a gate both coupled to said back gate of said first MOS transistor.

17. The output circuit according to claim 16, wherein said second MOS transistor has threshold voltage which is equal to or less than that of said first MOS transistor in terms of absolute value.

18. The output circuit according to claim 7, further comprising a second MOS transistor which has a source coupled to said first reference-potential node or said source of said first MOS transistor, a drain coupled to said back gate of said first MOS transistor, and a gate coupled to said gate of said first MOS transistor.

19. The output circuit according to claim 18, wherein said second MOS transistor has a threshold voltage which is equal to or less than that of said first MOS transistor in terms of absolute value.

20. The output circuit according to claim 7, further comprising a second MOS transistor which has a source coupled to said first reference-potential node or said source of said first MOS transistor, and a drain and a gate coupled to a node of said first path and said pre-driver circuit.

21. The output circuit according to claim 20 wherein said second MOS transistor has a threshold voltage which is equal to or less than that of said first MOS transistor in terms of absolute value.

22. The output circuit according to claim 7, further comprising a third MOS transistor which has a source coupled to said output terminal, and a drain and a gate both coupled to a midpoint of a path extending from a node of said first path gate and said pre-driver circuit to said gate of said first MOS transistor.

23. The output circuit according to claim 22, wherein said third MOS transistor has a threshold voltage which is equal to or less than that of said first MOS transistor in terms of absolute value.

24. The output circuit according to claim 7, further comprising a control MOS transistor having a source coupled to said gate of said first MOS transistor, a drain coupled to said output terminal, and a gate coupled to said first reference-potential node.

25. The output circuit according to claim 24, wherein said control MOS transistor has a threshold voltage which is equal to or less than that of said first MOS transistor in terms of absolute value.

26. The output circuit according to claim 7, further comprising a control MOS transistor having a source coupled to a midpoint of a path extending between said back gate and gate of said first MOS transistor, a drain coupled to said output terminal, and a gate coupled to said first reference-potential node.

27. The output circuit according to claim 26, wherein said control MOS transistor has a threshold voltage which is equal to or less than that of said first MOS transistor in terms of absolute value.

28. The output circuit according to claim 7, further comprising a control MOS transistor having a source coupled to said back gate of said first MOS transistor, a drain coupled to said output terminal, and a gate coupled to said first reference-potential node.

29. The output circuit according to claim 28, wherein said control MOS transistor has a threshold voltage which is equal to or less than that of said first MOS transistor in terms of absolute value.

30. The output circuit according to claim 28, wherein said control MOS transistor said first path gate and said second path gate each comprises a P-channel MOS transistor having a back gate coupled to said back gate of said first MOS transistor.

31. The output circuit according to claim 7, further comprising an N-channel MOS transistor having a drain coupled to said output terminal and a source coupled to said first low-potential node.

32. An output circuit comprising:

a first MOS transistor of P-channel type, having a source coupled to a high-potential node, a drain coupled to an output terminal, a gate, and a back gate isolated from both said source and said drain in terms of potential;

a potential-applying circuit comprising P-channel and N-channel MOS transistors, for applying a potential to said gate of said first MOS transistor, said potential-applying circuit including a first end coupled to a low-potential node, and a second end;

a second MOS transistor of P-channel type, having a source coupled to a high-potential node, a drain coupled to said second end of said potential-applying circuit, and a back gate coupled to said back gate of said first MOS transistor;

a third MOS transistor of P-channel type, having a source-drain path coupled between said back gate of said first MOS transistor and said drain of said second MOS transistor, and a back gate coupled to said back gate of said first MOS transistor; and a fourth MOS transistor of N-channel type, having a source coupled to said low-potential node, and a drain coupled to said output terminal.

33. The output circuit according to claim 32, further comprising a fifth MOS transistor of P-channel type, having a source coupled to said high-potential node, a drain coupled to said back gate of said first MOS transistor, and a back gate coupled to said back gate of said first MOS transistor.

34. The output circuit according to claim 32, further comprising a fifth MOS transistor of P-channel type, having a source coupled to said back gate of said first MOS transistor, a drain coupled to said output terminal, a gate coupled to said high-potential node, and a back gate coupled to said back gate of said first MOS transistor.

35. The output circuit according to claim 32, further comprising a fifth MOS transistor of P-channel type, having a source coupled to said high-potential node, a drain coupled to said back gate of said first MOS transistor, a gate coupled to said output terminal, and a back gate coupled to said back gate of said first MOS transistor.

36. The output circuit according to claim 32, further comprising a fifth MOS transistor of P-channel type, having a source coupled to said output terminal, a drain and a gate both coupled to said drain of said second MOS transistor, and a back gate coupled to said back gate of said first MOS transistor.

37. An output circuit comprising:

a first MOS transistor having a source, a drain, a gate and a back gate isolated from both said source and said drain in terms of potential;

a first switch coupled between said back gate and said gate of said first MOS transistor, said first switch being ON/OFF controlled by a control signal;

a potential-applying circuit for applying a potential to said gate of said first MOS transistor;

a second switch coupled between an output node of said potential-applying circuit and said gate of said first MOS transistor;

a first node supplied with a first reference potential; and a third switch coupled between said back gate of said first MOS transistor and said first node, wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to operate said first MOS transistor in a sub-threshold region, and wherein the control signal is a signal having a level which varies in accordance with an operational state of said output circuit.

38. An output circuit comprising:

first MOS transistor having a source, a drain, a gate and a back gate isolated from both said source and said drain in terms of potential;

a first switch coupled between said back gate and said gate of said first MOS transistor, said first switch being ON/OFF controlled by a control signal;

a potential-applying circuit for applying a potential to said gate of said first MOS transistor;

a second switch coupled between an output node of said potential-applying circuit and said gate of said first MOS transistor; and a third switch coupled between said back gate and said source of said first MOS transistor, wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to operate said first MOS transistor in a sub-threshold region, and wherein the control signal is a signal having a level which varies in accordance with an operational state of said output circuit.

39. An output circuit comprising:

a first MOS transistor having a source, a drain, a gate and a back gate isolated from both said source and said drain in terms of potential;

a first switch coupled between said back gate and said gate of said first MOS transistor, said first switch being ON/OFF controlled by a control signal;

a potential-applying circuit for applying a potential to said gate of said first MOS transistor; and a second switch coupled between an output node of said potential-applying circuit and said gate of said first MOS transistor, wherein a potential is generated at said back gate of said first MOS transistor so that said source and said back gate of said first MOS transistor have a voltage difference which is substantially equal to a junction voltage of a parasitic pn-junction diode formed between said source and said back gate of said first MOS transistor, and the potential at said back gate is applied to said gate of said first MOS transistor through said first switch, thereby to operate said first MOS transistor in a sub-threshold region, and wherein the control signal is a signal having a level which varies in accordance with an operational state of said output circuit.

40. An output circuit comprising:

a MOS transistor having a source, a drain, a gate, and a back gate isolated from both said source and said drain in terms of potential;

potential-generating means for generating a potential which differs from a source potential of said first MOS transistor by a voltage substantially equal to a junction voltage of a parasitic pn-junction diode formed between said source and said back gate of said first MOS transistor; and a switch coupled between an output of said potential-generating means and said gate of said MOS transistor, said switch being ON/OFF controlled by a control signal, wherein the control signal is a signal having a level which varies in accordance with an operational state of said output circuit.

* * * * *